(12) United States Patent
Newman et al.

(10) Patent No.: US 10,170,656 B2
(45) Date of Patent: Jan. 1, 2019

(54) INVERTED METAMORPHIC MULTIJUNCTION SOLAR CELL WITH A SINGLE METAMORPHIC LAYER

(71) Applicant: SolAero Technologies Corp., Albuquerque, NM (US)

(72) Inventors: Fred Newman, Albuquerque, NM (US); Benjamin Cho, Albuquerque, NM (US); Mark A. Stan, Albuquerque, NM (US); Paul Sharps, Albuquerque, NM (US)

(73) Assignee: SolAero Technologies Corp., Albuquerque, NM (US)

( * ) Notice: Subject to any disclaimer, the term of this patent is extended or adjusted under 35 U.S.C. 154(b) by 26 days.

(21) Appl. No.: 14/623,883

(22) Filed: Feb. 17, 2015

(65) Prior Publication Data
US 2017/0047466 A1 Feb. 16, 2017

Related U.S. Application Data

(60) Continuation-in-part of application No. 13/463,069, filed on May 3, 2012, now Pat. No. 8,969,712, which
(Continued)

(51) Int. Cl.
| | |
|---|---|
| *H01L 31/18* | (2006.01) |
| *H01L 31/0304* | (2006.01) |
| *H01L 31/0725* | (2012.01) |
| *H01L 31/0352* | (2006.01) |
| *H01L 31/0687* | (2012.01) |

(Continued)

(52) U.S. Cl.
CPC .. *H01L 31/06875* (2013.01); *H01L 31/03046* (2013.01); *H01L 31/03529* (2013.01); *H01L 31/0693* (2013.01); *H01L 31/0725* (2013.01); *H01L 31/0735* (2013.01);
(Continued)

(58) Field of Classification Search
USPC ........................................................ 136/255
See application file for complete search history.

(56) References Cited

U.S. PATENT DOCUMENTS

| | | |
|---|---|---|
| 3,488,834 A | 1/1970 | Baird |
| 3,964,155 A | 6/1976 | Leinkram et al. |

(Continued)

FOREIGN PATENT DOCUMENTS

| | | |
|---|---|---|
| EP | 1 109 230 A2 | 6/2001 |
| EP | 1 863 099 A2 | 12/2007 |

(Continued)

OTHER PUBLICATIONS

U.S. Appl. No. 12/265,113, filed Nov. 5, 2008, Varghese.
(Continued)

*Primary Examiner* — Shannon M Gardner

(57) ABSTRACT

The present disclosure provides a multijunction solar cell that includes: a first sequence of layers of semiconductor material forming a first set of one or more solar subcells; a graded interlayer adjacent to said first sequence of layers; a second sequence of layers of semiconductor material forming a second set of one or more solar subcells; and a high band gap contact layer adjacent said second sequence of layers, wherein the high band gap contact layer is composed of p++ type InGaAlAs or InGaAs.

12 Claims, 27 Drawing Sheets

Related U.S. Application Data is a division of application No. 12/401,157, filed on Mar. 10, 2009, now abandoned.

(51) Int. Cl.
  *H01L 31/0693* (2012.01)
  *H01L 31/0735* (2012.01)

(52) U.S. Cl.
  CPC ...... *H01L 31/1844* (2013.01); *H01L 31/1892* (2013.01); *Y02E 10/544* (2013.01)

(56) References Cited

U.S. PATENT DOCUMENTS

| | | | |
|---|---|---|---|
| 4,001,864 A | 1/1977 | Gibbons | |
| 4,255,211 A | 3/1981 | Fraas | |
| 4,338,480 A | 7/1982 | Antypas et al. | |
| 4,393,576 A | 7/1983 | Dahlberg | |
| 4,612,408 A | 9/1986 | Moddel et al. | |
| 4,881,979 A | 11/1989 | Lewis | |
| 5,019,177 A | 5/1991 | Wanlass | |
| 5,021,360 A | 6/1991 | Melman et al. | |
| 5,053,083 A | 10/1991 | Sinton | |
| 5,217,539 A | 6/1993 | Fraas et al. | |
| 5,322,572 A | 6/1994 | Wanlass | |
| 5,342,453 A | 8/1994 | Olson | |
| 5,376,185 A | 12/1994 | Wanlass | |
| 5,479,032 A | 12/1995 | Forrest et al. | |
| 5,510,272 A | 4/1996 | Morikawa et al. | |
| 5,944,913 A | 8/1999 | Hou et al. | |
| 6,165,873 A | 12/2000 | Hamada | |
| 6,180,432 B1 | 1/2001 | Freeouf | |
| 6,239,354 B1 | 5/2001 | Wanlass | |
| 6,252,287 B1 | 6/2001 | Kurtz et al. | |
| 6,281,426 B1 | 8/2001 | Olson et al. | |
| 6,300,557 B1 | 10/2001 | Wanlass | |
| 6,300,558 B1 | 10/2001 | Takamoto et al. | |
| 6,340,788 B1 | 1/2002 | King et al. | |
| 6,482,672 B1 | 11/2002 | Hoffman et al. | |
| 6,660,928 B1 | 12/2003 | Patton et al. | |
| 6,690,041 B2 | 2/2004 | Armstrong et al. | |
| 6,794,631 B2 | 9/2004 | Clark | |
| 6,815,736 B2 | 11/2004 | Mascarenhas | |
| 6,951,819 B2 | 10/2005 | Iles et al. | |
| 7,071,407 B2 | 7/2006 | Faterni et al. | |
| 7,122,734 B2 | 10/2006 | Fetzer et al. | |
| 7,166,520 B1 | 1/2007 | Henley | |
| 7,727,795 B2 | 6/2010 | Stan et al. | |
| 7,741,146 B2 | 6/2010 | Cornfeld et al. | |
| 7,785,989 B2 | 8/2010 | Sharps et al. | |
| 7,812,249 B2 | 10/2010 | King et al. | |
| 7,842,881 B2 | 11/2010 | Cornfeld et al. | |
| 7,846,759 B2 | 12/2010 | Atwater, Jr. et al. | |
| 7,960,201 B2 | 6/2011 | Cornfeld et al. | |
| 8,039,291 B2 | 10/2011 | Cornfeld et al. | |
| 8,067,687 B2 | 11/2011 | Wanlass | |
| 8,187,907 B1 | 5/2012 | Newman | |
| 8,227,689 B2 | 7/2012 | King et al. | |
| 8,236,600 B2 | 8/2012 | Cornfeld | |
| 8,263,853 B2 | 9/2012 | Varghese | |
| 8,263,856 B2 | 9/2012 | Cornfeld et al. | |
| 8,969,712 B2 | 3/2015 | Newman et al. | |
| 8,987,042 B2 | 3/2015 | Varghese et al. | |
| 9,018,521 B1 | 4/2015 | Cornfeld | |
| 9,117,966 B2 | 8/2015 | Cornfeld et al. | |
| 9,231,147 B2 | 1/2016 | Stan et al. | |
| 9,287,438 B1 | 3/2016 | Varghese et al. | |
| 2004/0079408 A1 | 4/2004 | Fetzer et al. | |
| 2004/0166681 A1 | 8/2004 | Illes et al. | |
| 2005/0211291 A1 | 9/2005 | Bianchi | |
| 2005/0274411 A1* | 12/2005 | King | H01L 31/0687 136/256 |
| 2006/0021565 A1 | 2/2006 | Zahler et al. | |
| 2006/0144435 A1* | 7/2006 | Wanlass | H01L 31/06875 136/249 |
| 2006/0162768 A1 | 7/2006 | Wanlass et al. | |
| 2006/0185582 A1 | 8/2006 | Atwater, Jr. et al. | |
| 2007/0137694 A1 | 6/2007 | Foster et al. | |
| 2007/0218649 A1 | 9/2007 | Hernandez | |
| 2007/0277873 A1 | 12/2007 | Cornfeld et al. | |
| 2008/0029151 A1 | 2/2008 | McGlynn et al. | |
| 2008/0149173 A1 | 6/2008 | Sharps | |
| 2008/0185038 A1 | 8/2008 | Sharps | |
| 2008/0245409 A1 | 10/2008 | Varghese et al. | |
| 2009/0038679 A1 | 2/2009 | Varghese et al. | |
| 2009/0078308 A1 | 3/2009 | Varghese et al. | |
| 2009/0078309 A1 | 3/2009 | Cornfeld et al. | |
| 2009/0078310 A1 | 3/2009 | Stan et al. | |
| 2009/0078311 A1 | 3/2009 | Stan et al. | |
| 2009/0155952 A1 | 6/2009 | Stan et al. | |
| 2009/0188546 A1 | 7/2009 | McGlynn et al. | |
| 2009/0223554 A1 | 9/2009 | Sharps | |
| 2009/0229658 A1 | 9/2009 | Stan et al. | |
| 2009/0229662 A1 | 9/2009 | Stan et al. | |
| 2009/0272430 A1 | 11/2009 | Cornfeld et al. | |
| 2009/0272438 A1 | 11/2009 | Cornfeld | |
| 2009/0288703 A1 | 11/2009 | Stan et al. | |
| 2009/0314348 A1 | 12/2009 | McGlynn et al. | |
| 2010/0012174 A1 | 1/2010 | Varghese et al. | |
| 2010/0012175 A1 | 1/2010 | Varghese et al. | |
| 2010/0041178 A1* | 2/2010 | Cornfeld | H01L 31/06875 438/93 |
| 2010/0047959 A1 | 2/2010 | Cornfeld et al. | |
| 2010/0093127 A1 | 4/2010 | Sharps et al. | |
| 2010/0122724 A1 | 5/2010 | Cornfeld et al. | |
| 2010/0122764 A1 | 5/2010 | Newman | |
| 2010/0147366 A1 | 6/2010 | Stan et al. | |
| 2010/0186804 A1 | 7/2010 | Cornfeld | |
| 2010/0203730 A1 | 8/2010 | Cornfeld et al. | |
| 2010/0206365 A1 | 8/2010 | Chumney et al. | |
| 2010/0229913 A1 | 9/2010 | Cornfeld | |
| 2010/0229926 A1 | 9/2010 | Newman et al. | |
| 2010/0229932 A1 | 9/2010 | Cornfeld et al. | |
| 2010/0229933 A1 | 9/2010 | Cornfeld | |
| 2010/0233838 A1 | 9/2010 | Varghese | |
| 2010/0236615 A1 | 9/2010 | Sharps | |
| 2010/0282288 A1 | 11/2010 | Cornfeld | |
| 2011/0041898 A1 | 2/2011 | Cornfeld | |
| 2012/0132250 A1 | 5/2012 | Cornfeld | |
| 2012/0142139 A1 | 6/2012 | Varghese | |
| 2012/0211047 A1 | 8/2012 | Cornfeld | |
| 2013/0139877 A1 | 6/2013 | Cornfeld | |
| 2013/0228216 A1 | 9/2013 | Cornfeld | |
| 2013/0312818 A1 | 11/2013 | Cornfeld et al. | |
| 2014/0166067 A1 | 6/2014 | McGlynn et al. | |

FOREIGN PATENT DOCUMENTS

| | | |
|---|---|---|
| EP | 0 658 944 B1 | 4/2009 |
| FR | 2 878 076 A1 | 5/2006 |
| WO | WO 2005/015638 A1 | 2/2005 |

OTHER PUBLICATIONS

U.S. Appl. No. 12/708,361, filed Feb. 18, 2010, Cornfeld et al.
U.S. Appl. No. 12/730,018, filed Mar. 23, 2010, Cornfeld.
U.S. Appl. No. 12/756,926, filed Apr. 8, 2010, Cornfeld et al.
U.S. Appl. No. 12/813,408, filed Jun. 10, 2010, Patel et al.
U.S. Appl. No. 12/844,673, filed Jul. 27, 2010, Stan et al.
U.S. Appl. No. 13/569,794, filed Aug. 8, 2012, Stan et al.
U.S. Appl. No. 13/604,883, filed Sep. 6, 2012, Tourino et al.
U.S. Appl. No. 14/026,818, filed Sep. 13, 2013, Miller et al.
U.S. Appl. No. 14/485,121, filed Sep. 12, 2014, Lin et al.
U.S. Appl. No. 14/485,378, filed Sep. 12, 2014, Yang et al.
Advisory Action dated Mar. 15, 2011. U.S. Appl. No. 11/445,793.
Aiken et al. "Consideration of High Bandgap Subcells for Advanced Multijunction Solar Cells," Conference Record of the 2006 IEEE 4th World Conference on Photovoltaic Energy Conversion, May 1, 2006, pp. 838-841.
Cornfeld et al., "Development of a Large Area Inverted Metamorphic Multi-junction (IMM) Highly Efficient AM0 Solar Cell," 33rd IEEE Photovoltaic Specialists Conference, May 11-16, 2008, San Diego, CA, USA.

(56) References Cited

OTHER PUBLICATIONS

Cornfeld et al., "Development of a Large Area Inverted Metamorphic Multi-junction Highly Efficient AM0 Solar Cell," Conference paper presented at the 33rd IEEE Photovoltaic Specialists Conference (May 11-16, 2008) on May 12, 2008. San Diego, CA, USA. 17 pages.

Cornfeld et al., "Advances in the Performance of Inverted Metamorphic Multi-junction Solar Cells," 23$^{rd}$ European Photovoltaic Energy Conference, Sep. 1-5, 2008, Valencia, Spain.

"European Search Report," Application No. EP 08 01 3466, dated Dec. 18, 2009. European Patent Office, Berlin, Germany.

Friedman et al., "0.7-eV GaInAs Junction for a GaInP/GaAs/GaInAs(1eV)/GaInAs(0.7eV) Four-Junction Solar Cell," 2006 IEEE 4th World Conference on Photovoltaic Energy Conversion, May 7-12, 2006, Waikoloa, Hawaii, USA.

Geisz et al., "High-efficiency GaInP/GaAs/InGaAs triple-junction solar cells grown inverted with a metamorphic bottom junction," *Applied Physics Letters*, 2007; 91(023502):023502-1-023502-3. Online publication Jul. 10, 2007. American Institute of Physics, Melville, NY, USA.

Geisz, et al., "Inverted GaInP/(In)GaAs/InGaAs Triple-Junction Solar Cells with Low-Stress Metamorphic Bottom Junctions," 33rd IEEE Photovoltaic Specialists Conference, May 11-16, 2008, San Diego, CA, USA.

King et al., "Next-Generation, High-Efficiency III-V Multijunction Solar Cells," 28$^{th}$ IEEE Photovoltaic Specialists Conference, Sep. 15-22, 2000, Anchorage, AK, USA.

King et al., "High-Efficiency Space and Terrestrial Multijunction Solar Cells Through Bandgap Control in Cell Structures," 2002 Photovoltaic Specialists Conference, Conference Record of the 29th IEEE, May 19-24, 2002, pp. 776-781. New Orleans, LA, USA.

Lewis et al., "The Crystallographic Connection of MOCVD-Grown Monolithic Cascade Subcells via Transparent Graded Layers," *Journal of Crystal Growth*, 1984; 69:515-526.

Lewis et al., "Recent Developments in Multijunction Solar Cell Research," *Solar Cells*, 1988; 24:171-183.

Office Action dated Nov. 9, 2010 (double patenting rejection). U.S. Appl. No. 11/860,183.

Office Action dated Nov. 10, 2010 (double patenting rejection). U.S. Appl. No. 12/102,550.

Office Action dated Dec. 22, 2010 (double patenting rejection). U.S. Appl. No. 11/956,069.

Office Action dated Jan. 4, 2011. U.S. Appl. No. 11/445,793. (Sexl reference, double patenting rejection).

"Partial European Search Report," Application No. EP 08 01 3466, dated Feb. 12, 2009. European Patent Office, Berlin, Germany.

Schultz et al. "High Efficiency 1.0 eV GaInAs Bottom Solar Cell for 3-junction Monolithic Stack," Conference Record of the Twenty First IEEE Photovoltaic Specialists Conference. Kissimmee, Florida; May 21-25, 1990. New York: The Institute of Electrical and Electronics Engineers, Inc., pp. 148-152.

Sexl et al., "MBE Growth of Metamorphic In(Ga)AIAs Buffers," 1997 IEEE International Symposium on Compound Semiconductors, Sep. 1997, pp. 49-52. IEEE, Piscataway, NJ.

Sharps et al., "Inverting the triple junction improves efficiency and flexibility," *Compound Semiconductor*, Oct. 2007; 13(9):25-28.

Sinharoy et al., "Progress in the Development of Metamorphic Multi junction III-V Space Solar Cells," *Progress in Photovoltaics: Research and Applications*, Feb. 2002; 10:427-432.

Stan et al., "Very High Efficiency Triple Junction Solar Cells by MOVPE," 14$^{th}$ International Conference of Metalorganic Vapor Phase Epitaxy. Jun. 1-6, 2008, Metz, France.

Stan, et al., "High-efficiency quadruple junction solar cells using OMVPE with inverted metamorphic device structures," *Journal of Crystal Growth*, 2010; 312:1370-1374. Elsevier, Amsterdam, Netherlands.

Takamoto, et al., "Future Development of InGaP/(In)GaAs Based Multijunction Solar Cells," Proceedings of the 31st IEEE PVSC, Jan. 3-7, 2005, pp. 519-524. Lake Buena Vista, FL.

Takamoto et al., "InGaP/GaAs-based Multijunction Solar Cells," *Progress in Photovoltaics: Research and Applications*, 2005; 13(495-511).

Venkatasubramanian et al., "An Inverted-Growth Approach to Development of an IR-Transparent, High-Efficiency AIGaAs/GaAs Cascade Solar Cell," 22nd IEEE Photovoltaic Specialists Conference, Oct. 7-11, 1991, Las Vegas, NV, USA.

Venkatasubramanian et al., "High-quality eutectic-metal-bonded AIGaAs—GaAs thin films on Si substrates," *Applied Physics Letters*, Feb. 17, 1992; 60(7):886-888.

Wanlass et al., "Lattice-Mismatched Approaches for High-Performance, III-V Photovoltaic Energy Converters," Proceedings of the 31st IEEE PVSC, Jan. 3-7, 2005. Lake Buena Vista, FL, USA.

Wanlass et al., "Lattice-Mismatched Approaches for High-Performance, III-V Photovoltaic Energy Converters," Conference Record of the 31st IEEE PVSC, Jan. 3, 2005; pp. 530-535. Piscataway, NJ, USA.

Wanlass et al., "Monolithic, Ultra-Thin GaInP/GaAs/GaInAs Tandem Solar Cells," 2006 4$^{th}$ IEEE World Conference on Photovoltaic Energy Conversion, May 1, 2006; pp. 729-732.

Wanlass et al., "Monolithic, Ultra-Thin GaInP/GaAs/GaInAs Tandem Solar Cells," 2006 IEEE World Conference on Photovoltaic Energy Conversion, May 7-12, 2006, Waikoloa, Hawaii, USA.

Wurfel. *Physics of Solar Cells: from Basic Principles to Advanced Concepts, 2nd Updated and Expanded Edition*, 2009. Sections 6.4, 6.5 and 6.8; 20 pages. Wiley-VCH, Weinheim, Germany.

Yamaguchi, "Physics and Technologies of Superhigh-Effficiency Tandem Solar Cells," *Semiconductors*, Sep. 1999; 33(9):961-964, Toyota Technological Institute, Nagoya, Japan, © 1999, American Institute of Physics.

Yoon et al., "Progress of Inverted Metamorphic III-V Solar Cell Development at Spectrolab," 33rd IEEE Photovoltaic Specialists Conference, May 11-16 2008, San Diego, CA, USA.

\* cited by examiner

| | | | |
|---|---|---|---|
| cell D | p++ InGaAlAs | p contact layer | 129 |
| | p+ InGaAlAs | BSF | 128 |
| | p InGaAs | p base | 127 |
| | n+ InGaAs | n+ emitter | 126 |
| | n+ InGaAlAs | window | 125 |
| | n++ GaInAsp | n+ tunnel diode | 122b |
| | p++ GaInAsp | p+ tunnel diode | 122a |
| | p+ AlGaInAsP | BSF | 121 |
| cell C | p GaInAsp | p base | 120 |
| | n+ GaInAsp | n+ emitter | 119 |
| | n+ AlGaInAsP | window | 118 |
| | n+ AlGaInAsP | barrier layer | 117 |
| | n InGaAlAs | metamorphic buffer layer | 116 |
| | n GaInP | barrier layer | 115 |
| | n++ InGaP | n++ tunnel diode | 114b |
| | p++ AlGaAs | p++ tunnel diode | 114a |
| | p+ AlGaAs | BSF | 113 |
| cell B | p GaAs | p base | 112 |
| | n+ GaInP$_2$ | n+ emitter | 111 |
| | n+ GaInP$_2$ | window | 110 |
| | n++ InGaP | n++ tunnel diode | 109b |
| | p++ AlGaAs | p++ tunnel diode | 109a |
| | p+ AlGaInP | BSF | 108 |
| cell A | p GaInP$_2$ | p base | 107 |
| | n+ GaInP$_2$ | n+ emitter | 106 |
| | n+ AlInP$_2$ | window | 105 |
| | n++ GaAs | contact layer | 104 |
| | GaInP$_2$ | etch stop layer | 103 |
| | GaAs | buffer layer | 102 |
| | GaAs | Substrate | 101 |

FIG. 5

INVERTED METAMORPHIC MULTIJUNCTION SOLAR CELL WITH A SINGLE METAMORPHIC LAYER

This application is a continuation-in-part of application Ser. No. 13/463,069, filed May 3, 2012, which is a Divisional of application Ser. No. 12/401,157, filed Mar. 10, 2009, all of which are incorporated herein by reference in their entireties.

REFERENCE TO RELATED APPLICATIONS

This application is related to co-pending U.S. application Ser. No. 13/315,877, filed Dec. 9, 2011.

This application is related to co-pending U.S. application Ser. No. 13/569,794, filed Aug. 8, 2012.

This application is related to co-pending U.S. application Ser. No. 13/440,331, filed Apr. 5, 2012.

This application is related to co-pending U.S. application Ser. No. 13/754,730 filed Jan. 30, 2013.

This application is related to co-pending U.S. application Ser. No. 14/284,909, filed May 22, 2014.

This application is related to co-pending U.S. application Ser. No. 12/218,558 filed Jul. 17, 2008.

This application is related to co-pending U.S. application Ser. No. 12/123,864 filed May 20, 2008.

This application is related to co-pending U.S. application Ser. No. 11/860,183 filed Sep. 24, 2007.

This application is related to co-pending U.S. application Ser. No. 13/604,883 filed Sep. 6, 2012.

This application is related to co-pending U.S. application Ser. No. 14/485,378, filed Sep. 12, 2014.

This application is related to co-pending U.S. application Ser. No. 12/768,457 filed Apr. 27, 2010.

This application is related to co-pending U.S. application Ser. No. 14/186,287 filed Feb. 21, 2014.

This application is related to co-pending U.S. application Ser. No. 13/956,122, filed Jul. 31, 2013.

This application is related to co-pending U.S. application Ser. No. 12/813,408, filed Jun. 10, 2010.

This application is related to co-pending U.S. application Ser. No. 13/401,181, filed Feb. 21, 2012.

This application is related to co-pending U.S. application Ser. No. 13/768,683, filed Feb. 15, 2013.

This application is related to co-pending U.S. application Ser. No. 13/836,742, filed Mar. 15, 2013.

This application is related to co-pending U.S. application Ser. No. 14/026,818, filed Sep. 13, 2013.

This application is related to co-pending U.S. application Ser. No. 14/473,703, filed Aug. 29, 2014.

This application is related to co-pending U.S. application Ser. No. 14/485,121, filed Sep. 12, 2014.

This application is related to co-pending U.S. application Ser. No. 12/844,673, filed Jul. 27, 2010.

This application is related to co-pending U.S. application Ser. No. 13/372,068, filed Feb. 13, 2012.

GOVERNMENT RIGHTS STATEMENT

This invention was made with government support under Contract No. FA9453-06-C-0345 awarded by the U.S. Air Force. The Government has certain rights in the invention.

BACKGROUND OF THE INVENTION

1. Field of the Invention

The present invention relates to the field of semiconductor devices, and to fabrication processes and devices such as multijunction solar cells based on III-V semiconductor compounds including a metamorphic layer. Such devices are also known as inverted metamorphic multijunction solar cells.

2. Description of the Related Art

Solar power from photovoltaic cells, also called solar cells, has been predominantly provided by silicon semiconductor technology. In the past several years, however, high-volume manufacturing of III-V compound semiconductor multifunction solar cells for space applications has accelerated the development of such technology not only for use in space but also for terrestrial solar power applications. Compared to silicon, III-V compound semiconductor multijunction devices have greater energy conversion efficiencies and generally more radiation resistance, although they tend to be more complex to manufacture. Typical commercial III-V compound semiconductor multijunction solar cells have energy efficiencies that exceed 27% under one sun, air mass 0 (AM0), illumination, whereas even the most efficient silicon technologies generally reach only about 18% efficiency under comparable conditions. Under high solar concentration (e.g., 500×), commercially available HI-V compound semiconductor multijunction solar cells in terrestrial applications (at AM1.5D) have energy efficiencies that exceed 37%. The higher conversion efficiency of III-V compound semiconductor solar cells compared to silicon solar cells is in part based on the ability to achieve spectral splitting of the incident radiation through the use of a plurality of photovoltaic regions with different band gap energies, and accumulating the current from each of the regions.

Typical III-V compound semiconductor solar cells are fabricated on a semiconductor wafer in vertical, multijunction structures. The individual solar cells or wafers are then disposed in horizontal arrays, with the individual solar cells connected together in an electrical series circuit. The shape and structure of an array, as well as the number of cells it contains, are determined in part by the desired output voltage and current.

Inverted metamorphic solar cell structures based on III-V compound semiconductor layers, such as described in M. W. Wanlass et al., Lattice Mismatched Approaches for High Performance, III-V Photovoltaic Energy Converters (Conference Proceedings of the 31$^{st}$ IEEE Photovoltaic Specialists Conference, Jan. 3-7, 2005, IEEE Press, 2005), present an important conceptual starting point for the development of future commercial high efficiency solar cells. However, the materials and structures for a number of different layers of the cell proposed and described in such reference present a number of practical difficulties relating to the appropriate choice of materials and fabrication steps.

Prior to the present invention, the materials and fabrication steps disclosed in the prior art have not been adequate to produce a commercially viable and energy efficient solar cell using commercially established fabrication processes for producing an inverted metamorphic multijunction cell structure.

SUMMARY OF THE INVENTION

Briefly, and in general terms, the present disclosure provides a multijunction solar cell comprising: a first sequence of layers of semiconductor material forming a first set of one or more solar subcells; a graded interlayer adjacent to said first sequence of layers, said graded interlayer being composed of $(In_xGa_{1-x})_y Al_{1-y}As$, wherein $0<x<1$ and $0<y<1$ with x and y selected such that the band gap of said interlayer remains constant throughout its thickness; a second sequence of layers of semiconductor material forming a second set of one or more solar subcells adjacent said graded interlayer; and a high band gap contact layer adjacent said second sequence of layers, wherein the high band gap contact layer is composed of p++ type InGaAlAs or InGaAs.

In another aspect, the present disclosure provides a method of manufacturing a solar cell comprising: providing a first substrate; forming a first sequence of layers of semiconductor material forming a first set of one or more solar subcells; forming a graded interlayer adjacent to said first sequence of layers, said graded interlayer being composed of $(In_xGa_{1-x})_y Al_{1-y}As$, wherein $0<x<1$ and $0<y<1$ with x and y selected such that the band gap of said interlayer remains constant throughout its thickness; forming a second sequence of layers of semiconductor material forming a second set of one or more solar subcells adjacent to said graded interlayer; forming a high band gap contact layer adjacent said second sequence of layers, wherein the high band gap contact layer is composed of p++ type InGaAlAs or InGaAs; mounting a surrogate substrate on top of the high band gap contact layer; and removing the first substrate.

In still another aspect, the present disclosure provides a method of manufacturing a solar cell comprising: providing a first substrate; depositing on the first substrate a first sequence of layers of semiconductor material forming a first set of one or more solar subcells; depositing on said first set of one or more solar subcells a grading interlayer; depositing on said grading interlayer a second sequence of layers of semiconductor material including a second set of one or more solar subcells; forming a high band gap contact layer adjacent said second sequence of layers, wherein the high band gap contact layer is composed of p++ type InGaAlAs or InGaAs; mounting and bonding a surrogate substrate on top of the high band gap contact layer; and removing the first substrate.

BRIEF DESCRIPTION OF THE DRAWING

The invention will be better and more fully appreciated by reference to the following detailed description when considered in conjunction with the accompanying drawings, wherein:

FIG. 5 is a cross-sectional view of the solar cell of FIG. 4 after the next sequence of process steps;

DESCRIPTION OF PREFERRED EMBODIMENTS

Figure 1:
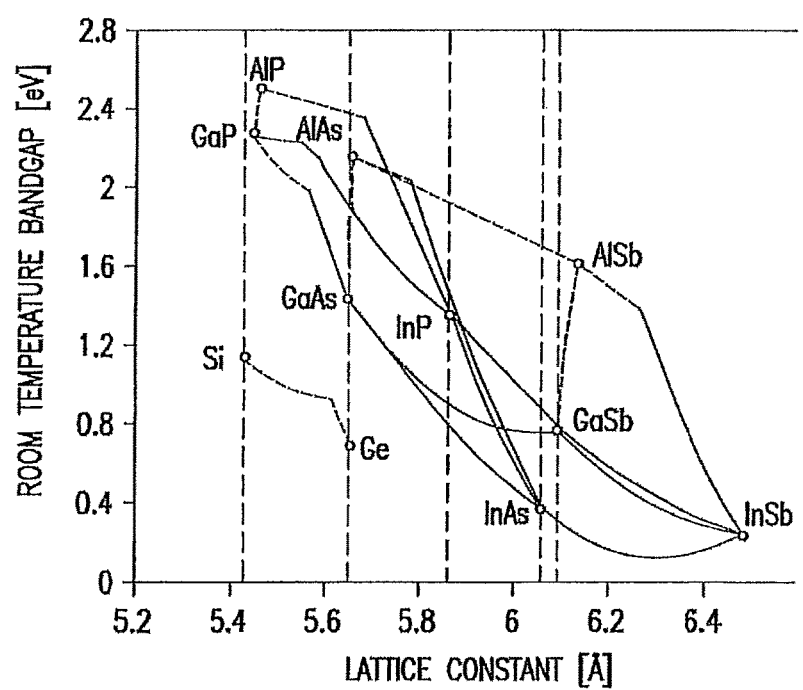
FIG. 1 is a graph representing the bandgap of certain binary materials and their lattice constants.

Details of the present invention will now be described including exemplary aspects and embodiments thereof Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

The basic concept of fabricating an inverted metamorphic multijunction (IMM) solar cell is to grow the subcells of the solar cell on a substrate in a "reverse" sequence. That is, the high band gap subcells (i.e. subcells with band gaps in the range of 1.8 to 2.1 eV), which would normally be the "top" subcells facing the solar radiation, are grown epitaxially on a semiconductor growth substrate, such as for example GaAs or Ge, and such subcells are therefore lattice-matched to such substrate. One or more lower band gap middle subcells (i.e. with band gaps in the range of 1.2 to 1.8 eV) can then be grown on the high band gap subcells.

At least one lower subcell is formed over the middle subcell such that the at least one lower subcell is substantially lattice-mismatched with respect to the growth substrate and such that the at least one lower subcell has a third lower band gap (i.e. a band gap in the range of 0.7 to 1.2 eV). A surrogate substrate or support structure is then attached or provided over the "bottom" or substantially lattice-mismatched lower subcell, and the growth semiconductor substrate is subsequently removed. (The growth substrate may then subsequently be re-used for the growth of a second and subsequent solar cells).

A variety of different features of inverted metamorphic multijunction solar cells are disclosed in the related applications noted above. Some or all of such features may be included in the structures and processes associated with the solar cells of the present invention. However, more particularly, the present invention is directed to the fabrication of a multijunction inverted metamorphic solar cell using a single metamorphic layer, all grown on a single growth substrate. In the present invention, the resulting construction can include four subcells, with band gaps in the range of 1.8 to 2.1 eV, 1.3 to 1.5 eV, 0.9 to 1.1 eV, and 0.6 to 0.8 eV respectively.

FIG. 1 is a graph representing the band gap of certain binary materials and their lattice constants. The band gap and lattice constants of ternary materials are located on the lines drawn between typical associated binary materials (such as the ternary material GaAlAs being located between the GaAs and AlAs points on the graph, with the band gap of the ternary material lying between 1.42 eV for GaAs and 2.16 eV for AlAs depending upon the relative amount of the individual constituents). Thus, depending upon the desired band gap, the material constituents of ternary materials can be appropriately selected for growth.

The lattice constants and electrical properties of the layers in the semiconductor structure are preferably controlled by specification of appropriate reactor growth temperatures and times, and by use of appropriate chemical composition and dopants. The use of a vapor deposition method, such as Organo Metallic Vapor Phase Epitaxy (OMVPE), Metal Organic Chemical Vapor Deposition (MOCVD), Molecular Beam Epitaxy (MBE), or other vapor deposition methods for the reverse growth may enable the layers in the monolithic semiconductor structure forming the cell to be grown with the required thickness, elemental composition, dopant concentration and grading and conductivity type.

Figure 2:
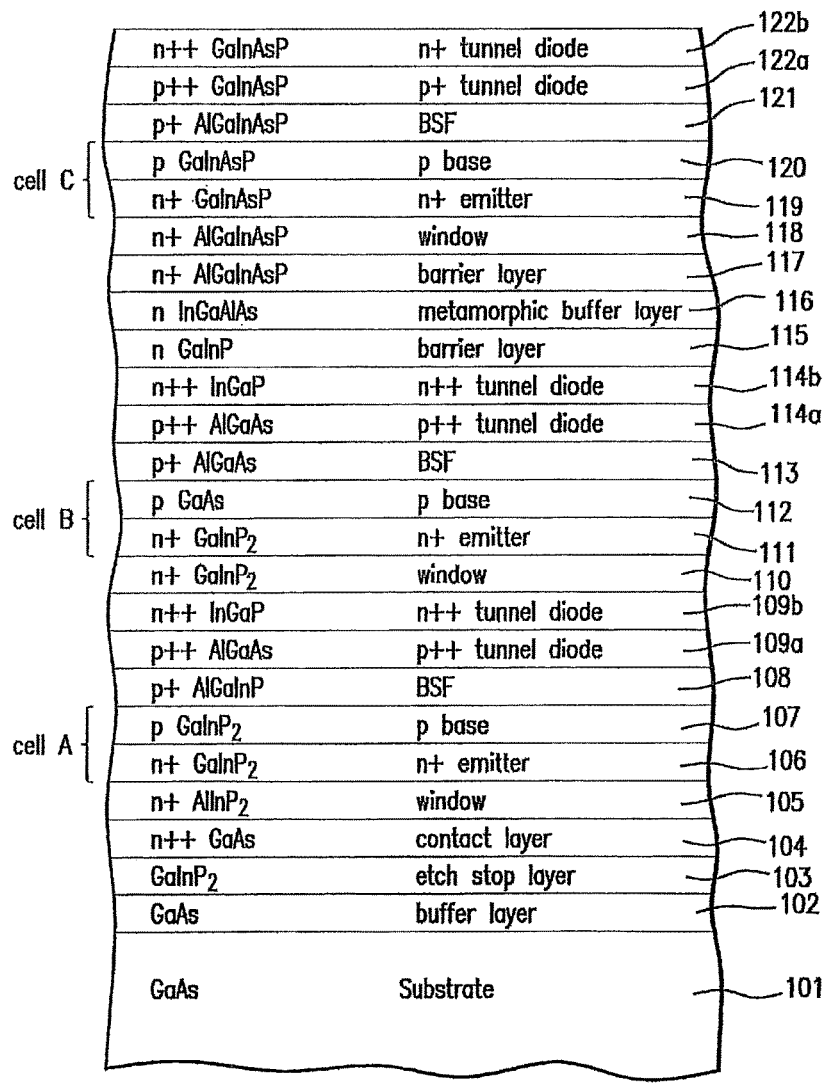
FIG. 2 is a cross-sectional view of the solar cell of the present invention after an initial stage of fabrication including the deposition of certain semiconductor layers on the growth substrate.

FIG. 2 depicts the multijunction solar cell according to the present invention after the sequential formation of the three subcells A, B and C on a GaAs growth substrate. More particularly, there is shown a substrate 101, which is preferably gallium arsenide (GaAs), but may also be germanium (Ge) or other suitable material. For GaAs, the substrate is preferably a 15° off-cut substrate, that is to say, its surface is orientated 15° off the (100) plane towards the (111)A plane, as more fully described in U.S. application Ser. No. 12/047,944, filed Mar. 13, 2008.

In the case of a Ge substrate, a nucleation layer (not shown) is deposited directly on the substrate 101. On the substrate, or over the nucleation layer (in the case of a Ge substrate), a buffer layer 102 and an etch stop layer 103 are further deposited. In the case of GaAs substrate, the buffer layer 102 is preferably GaAs. In the case of Ge substrate, the buffer layer 102 is preferably InGaAs. A contact layer 104 of GaAs is then deposited on layer 103, and a window layer 105 of AlInP is deposited on the contact layer. The subcell A, consisting of an n+ emitter layer 106 and a p-type base layer 107, is then epitaxially deposited on the window layer 105. The subcell A is generally latticed matched to the growth substrate 101.

It should be noted that the multijunction solar cell structure could be formed by any suitable combination of group III to V elements listed in the periodic table subject to lattice constant and bandgap requirements, wherein the group III includes boron (B), aluminum (Al), gallium (Ga), indium (In), and thallium (T). The group IV includes carbon (C), silicon (Si), germanium (Ge), and tin (Sn). The group V includes nitrogen (N), phosphorous (P), arsenic (As), antimony (Sb), and bismuth (Bi).

In one embodiment, the emitter layer 106 is composed of InGa(Al)P and the base layer 107 is composed of InGa(Al)P. The aluminum or Al term in parenthesis in the preceding formula means that Al is an optional constituent, and in this instance may be used in an amount ranging from 0% to 30%. The doping profile of the emitter and base layers 106 and 107 according to the present invention will be discussed in conjunction with FIG. 20.

Subcell A will ultimately become the "top" subcell of the inverted metamorphic structure after completion of the process steps according to the present invention to be described hereinafter.

On top of the base layer 107 a back surface field ("BSF") layer 108 preferably p+ AlGaInP is deposited and used to reduce recombination loss.

The BSF layer 108 drives minority carriers from the region near the base/BSF interface surface to minimize the effect of recombination loss. In other words, a BSF layer 18 reduces recombination loss at the backside of the solar subcell A and thereby reduces the recombination in the base.

On top of the BSF layer 108 is deposited a sequence of heavily doped p-type and n-type layers 109a and 109b that forms a tunnel diode, i.e. an ohmic circuit element that connects subcell A to subcell B. Layer 109a is preferably composed of p AlGaAs, and layer 109b is preferably composed of n++ InGaP.

On top of the tunnel diode layers 109 a window layer 110 is deposited, preferably n+ InGaP. The advantage of utilizing InGaP as the material constituent of the window layer 110 is that it has an index of refraction that closely matches the adjacent emitter layer 111, as more fully described in U.S. application Ser. No. 12/258,190, filed Oct. 24, 2008. The window layer 110 used in the subcell B also operates to reduce the interface recombination loss. It should be apparent to one skilled in the art, that additional layer(s) may be added or deleted in the cell structure without departing from the scope of the present invention.

On top of the window layer 110 the layers of subcell B are deposited: the n-type emitter layer 111 and the p-type base layer 112. These layers are preferably composed of InGaP and $In_{0.015}GaAs$ respectively (for a Ge substrate or growth template), or InGaP and GaAs respectively (for a GaAs substrate), although any other suitable materials consistent with lattice constant and bandgap requirements may be used as well. Thus, subcell B may be composed of a GaAs, GaInP, GaInAs, GaAsSb, or GaInAsN emitter region and a GaAs, GaInAs, GaAsSb, or GaInAsN base region. The doping profile of layers 111 and 112 according to the present invention will be discussed in conjunction with FIG. 20.

In previously disclosed implementations of an inverted metamorphic solar cell, the middle cell was a homostructure. In the present invention, similarly to the structure disclosed in U.S. application Ser. No. 12/023,772, the middle subcell becomes a heterostructure with an InGaP emitter and its window is converted from InAlP to InGaP. This modification eliminated the refractive index discontinuity at the window/emitter interface of the middle sub-cell, as more fully described in U.S. application Ser. No. 12/258,190, filed Oct. 24, 2008. Moreover, the window layer 110 is preferably is doped three times that of the emitter 111 to move the Fermi level up closer to the conduction band and therefore create band bending at the window/emitter interface which results in constraining the minority carriers to the emitter layer.

In one embodiment of the present invention, the middle subcell emitter has a band gap equal to the top subcell emitter, and the third subcell emitter has a band gap greater than the band gap of the base of the middle subcell. Therefore, after fabrication of the solar cell, and implementation and operation, neither the emitters of middle subcell B nor the third subcell C will be exposed to absorbable radiation. Substantially all of the photons representing absorbable radiation will be absorbed in the bases of cells B and C, which have narrower band gaps then the emitters. Therefore, the advantages of using heterojunction subcells are: (i) the short wavelength response for both subcells will improve, and (ii) the bulk of the radiation is more effectively absorbed and collected in the narrower band gap base. The effect will be to increase $J_{sc}$.

On top of the cell B is deposited a BSF layer 113 which performs the same function as the BSF layer 109. The p++/n++ tunnel diode layers 114a and 114b respectively are deposited over the BSF layer 113, similar to the layers 109a and 109b, forming an ohmic circuit element to connect subcell B to subcell C. The layer 114a is preferably composed of p++ AlGaAs, and layer 114b is preferably composed of n++ InGaP.

In some embodiments, a threading dislocation inhibition (or "barrier") layer 115, composed of n-type InGa(Al)P, is deposited over the tunnel diode 114a/114b, to a thickness from 0.25 to 1.0 micron. Such threading dislocation inhibition layer is disposed directly adjacent to the subsequently deposited metamorphic layer. The threading dislocation inhibition layer is intended to prevent threading dislocations associated with the stresses introduced by the various lattice mismatched or grading layers within the metamorphic layer from propagating, either opposite to the direction of growth into the middle and top subcells A and B, or in the direction of growth into the bottom subcell C. The performance improvement and other advantages of including such a distinct threading dislocation inhibition layer are more particularly described in copending U.S. application Ser. No. 11/860,183, filed Sep. 24, 2007. For convenience in labeling the layer in the drawings of the present application, we utilize the shorthand "barrier layer" but it is to be understood as a threading dislocation inhibition layer.

In that connection, it should be emphasized here that although the term "barrier layer" has previously been used by Applicants in the earlier U.S. patent application Ser. No. 11/860,183, and by other researchers in the published literature for a variety of sundry layers in a solar cell not serving the same purpose as the identified layer in Applicant's solar cell, in the present application the identified threading dislocation inhibition layer has a particular meaning that would be readily apparent to the person of ordinary skill in the field in view of structure of an inverted metamorphic solar cell and the stresses introduced and propagated by the lattice mismatching of not only the adjacent subcells but also the sublayers within the graded metamorphic layer itself. By expressly identifying the layer as threading dislocation inhibition layer it is intended to avoid any ambiguity or unwarranted assumptions concerning the composition, function and/or effect of such layer. In particular, identifying such layer as a threading dislocation inhibition layer (or in shorthand as a distinct "barrier" layer) in this and previous applications, such nomenclature signifies that the threading dislocation inhibition layer has a different and distinct composition from the directly adjacent layers. Thus, the introduction of the threading dislocation inhibition layer or "barrier" layer into a solar cell is a distinctive feature of U.S. patent application Ser. No. 11/860,183, and of the present disclosure. By placing such a layer in the designated position in the illustrated embodiments, the threading dislocation inhibition layer will have a function and effect which results in a demonstrable improvement in the ultimate performance, reliability, manufacturability, or other mechanical and processing related characteristics of the solar cell into which it is implemented.

In utilizing the terminology "different and distinct composition" in the preceding paragraph, and throughout this disclosure, we mean, most generally, a layer with different constituent elements, or the same constituent elements in different proportions or mole fractions (which would result in different lattice constants for the two materials), or the same constituent elements with different dopants, dopant concentrations, or dopant profiles such that the operational characteristics of the different layers are distinct and different.

A metamorphic layer (or graded interlayer) 116 is deposited directly over the threading dislocation inhibition layer 115, in some embodiments using a surfactant. Layer 116 is referred to as a graded interlayer since in some embodiments it is preferably a compositionally step-graded series of InGaAlAs layers, preferably with monotonically changing lattice constant in each step, so as to achieve a gradual transition in lattice constant in the semiconductor structure from the lattice constant of subcell B to the lattice constant of subcell C while minimizing threading dislocations from occurring. In some embodiments, the band gap of layer 116 is constant throughout its thickness, at approximately 1.6 eV (i.e., 1.6 eV±3% or in the range of about 1.55 eV to 1.65 eV), or otherwise consistent with a value slightly greater than the base bandgap of the middle subcell B. In some embodiments, the graded interlayer may be composed of $(In_xGa_{1-x})_yAl_{1-y}As$, with $0<x<1$, $0<y<1$, and the values of x and y selected for each respective layer such that the band gap of the entire interlayer remains constant at approximately 1.6 eV (i.e., 1.6 eV±3% or in the range of about 1.55 eV to 1.65 eV), or other appropriate band gap over its thickness. In some embodiments, the graded interlayer has a band gap that remains constant at approximately 1.5 eV over the entire interlayer, or a portion thereof.

In the surfactant assisted growth of the metamorphic layer 116, a suitable chemical element is introduced into the reactor during the growth of layer 116 to improve the surface characteristics of the layer. In one embodiment, such element may be a dopant or donor atom such as selenium (Se) or tellurium (Te). Small amounts of Se or Te are therefore incorporated in the metamorphic layer 116, and remain in the finished solar cell. Although Se or Te are the preferred n-type dopant atoms, other non-isoelectronic surfactants may be used as well.

Surfactant assisted growth results in a much smoother or planarized surface. Since the surface topography affects the bulk properties of the semiconductor material as it grows and the layer becomes thicker, the use of the surfactants minimizes threading dislocations in the active regions, and therefore improves overall solar cell efficiency.

As an alternative to the use of non-isoelectronic one may use an isoelectronic surfactant. The term "isoelectronic" refers to surfactants such as antimony (Sb) or bismuth (Bi), since such elements have the same number of valence electrons as the P atom of InGaP, or the As atom in InGaAlAs, in the metamorphic buffer layer. Such Sb or Bi surfactants will not typically be incorporated into the metamorphic layer 116.

In an alternative embodiment where the solar cell has only two subcells, and the "middle" cell B is the uppermost or top subcell in the final solar cell, wherein the "top" subcell B would typically have a bandgap of 1.8 to 1.9 eV, then the band gap of the interlayer would remain constant at 1.9 eV.

In the inverted metamorphic structure described in the Wanlass et al. paper cited above, the metamorphic layer consists of nine compositionally graded InGaP steps, with each step layer having a thickness of 0.25 micron. As a result, each layer of Wanlass et al. has a different bandgap. In one embodiment of the present invention, the layer 116 is composed of a plurality of layers of InGaAlAs, with monotonically changing lattice constant, each layer having the same band gap, approximately 1.6 eV.

The advantage of utilizing a constant bandgap material such as InGaAlAs is that arsenide-based semiconductor material is much easier to process in standard commercial MOCVD reactors, while the small amount of aluminum assures radiation transparency of the metamorphic layers.

Although one embodiment of the present invention utilizes a plurality of layers of InGaAlAs for the metamorphic layer 116 for reasons of manufacturability and radiation transparency, other embodiments of the present invention may utilize different material systems to achieve a change in lattice constant from subcell B to subcell C. Thus, the system of Wanlass using compositionally graded InGaP is a second embodiment of the present invention. Other embodiments of the present invention may utilize continuously graded, as opposed to step graded, materials. More generally, the graded interlayer may be composed of any of the As, P, N, Sb based III-V compound semiconductors subject to the constraints of having the in-plane lattice parameter greater or equal to that of the second solar cell and less than or equal to that of the third solar cell, and having a bandgap energy greater than that of the second solar cell.

In another embodiment of the present invention, an optional second barrier layer 117 may be deposited over the InGnAlAs metamorphic layer 116. The second barrier layer 117 will typically have a different composition than that of barrier layer 115, and performs essentially the same function of preventing threading dislocations from propagating. In one embodiment, barrier layer 117 is n+ type GaInP.

A window layer 118 preferably composed of n+ type GaInP is then deposited over the barrier layer 117 (or directly over layer 116, in the absence of a second barrier layer). This window layer operates to reduce the recombination loss in subcell "C". It should be apparent to one skilled in the art that additional layers may be added or deleted in the cell structure without departing from the scope of the present invention.

On top of the window layer 118, the layers of cell C are deposited: the n+ emitter layer 119, and the p-type base layer 120. These layers are preferably composed of n+ type InGaAs and n+ type InGaAs respectively, or n+ type InGaP and p type InGaAs for a heterojunction subcell, although another suitable materials consistent with lattice constant and bandgap requirements may be used as well. For example, these layers may be composed of n+ type GaInAsP and p-type GaInAsP, respectively. The doping profile of layers 119 and 120 will be discussed in connection with FIG. 20.

A BSF layer 121, preferably composed of InGaAlAs, is then deposited on top of the cell C, the BSF layer performing the same function as the BSF layers 108 and 113.

The p++/n++ tunnel diode layers 122a and 122b respectively are deposited over the BSF layer 121, similar to the layers 114a and 114b, forming an ohmic circuit element to connect subcell C to subcell D. The layer 122a is preferably composed of p++ InGaAlAs, and layer 122b is preferably composed of n++ InGaAlAs.

Figure 3:
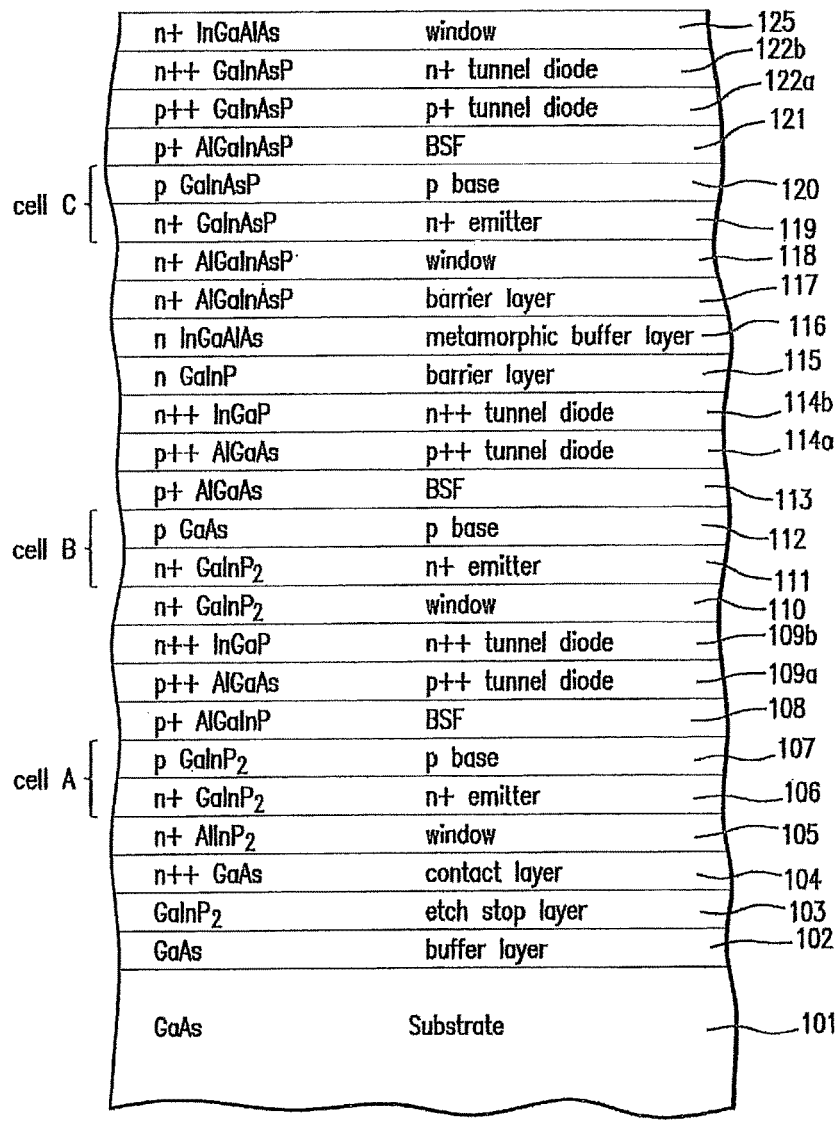
FIG. 3 is a cross-sectional view of the solar cell of FIG. 2 after the next sequence of process steps.

FIG. 3 depicts a cross-sectional view of the solar cell of FIG. 2 after the next sequence of process steps. A barrier layer 123, preferably composed of n-type GaInP, is deposited over the tunnel diode 122a/122b, to a thickness of about 1.0 micron. Such barrier layer is intended to prevent threading dislocations from propagating, either opposite to the direction of growth into the top and middle subcells A, B and C, or in the direction of growth into the subcell D, and is more particularly described in copending U.S. application Ser. No. 11/860,183, filed Sep. 24, 2007.

A metamorphic layer (or graded interlayer) 124 is deposited over the barrier layer 123 using a surfactant. Layer 124 is preferably a compositionally step-graded series of InGaAlAs layers, preferably with monotonically changing lattice constant, so as to achieve a gradual transition in lattice constant in the semiconductor structure from subcell C to subcell D while minimizing threading dislocations from occurring. The band gap of layer 124 is constant throughout its thickness, preferably approximately equal to 1.1 eV, or otherwise consistent with a value slightly greater than the band gap of the middle subcell C. One embodiment of the graded interlayer may also be expressed as being composed of $(In_xGa_{1-x})_yAl_{1-y}As$, wherein 0<x<1 and 0<y<1, with x and y selected such that the band gap of the interlayer remains constant at approximately 1.1 eV or other appropriate band gap.

In the surfactant assisted growth of the metamorphic layer 124, a suitable chemical element is introduced into the reactor during the growth of layer 124 to improve the surface characteristics of the layer. In one embodiment, such element may be a dopant or donor atom such as selenium (Se) or tellurium (Te). Small amounts of Se or Te are therefore incorporated in the metamorphic layer 124, and remain in the finished solar cell. Although Se or Te are the preferred n-type dopant atoms, other non-isoelectronic surfactants may be used as well.

A window layer 125 preferably composed of n+ type InGaAlAs is then deposited over layer 124 (or over a second barrier layer, if there is one, disposed over layer 124). This window layer operates to reduce the recombination loss in the fourth subcell "D". It should be apparent to one skilled in the art that additional layers may be added or deleted in the cell structure without departing from the scope of the present invention.

Figure 4:
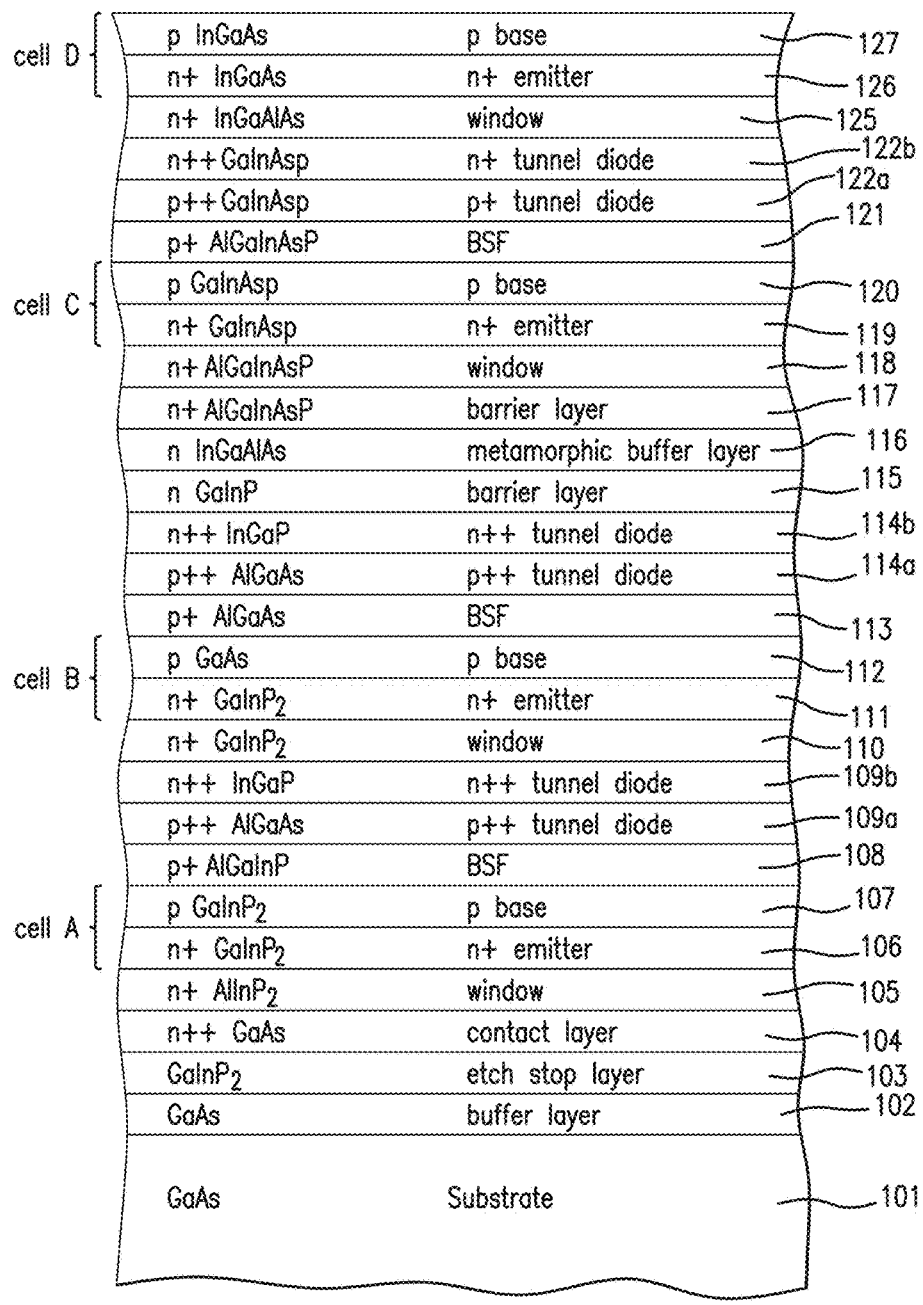
FIG. 4 is a cross-sectional view of the solar cell of FIG. 3 after the next sequence of process steps.

FIG. 4 depicts a cross-sectional view of the solar cell of FIG. 3 after the next sequence of process steps. On top of the window layer 125, the layers of cell D are deposited: the n+ emitter layer 126, and the p-type base layer 127. These layers are preferably composed of n+ type InGaAs and p type InGaAs, respectively, or n+ type InGaP and p type InGaAs for a heterojunction subcell, although another suitable material consistent with lattice constant and bandgap requirements may be used as well. The doping profile of layers 126 and 127 will be discussed in connection with FIG. 20.

Turning next to FIG. 5, a BSF layer 128, preferably composed of p+ type InGaAlAs, is then deposited on top of the cell D, the BSF layer performing the same function as the BSF layers 108, 113 and 121.

Finally a high band gap contact layer 129, composed of p++ type InGaAlAs, is deposited on the BSF layer 128. The InGaAlAs can have a band gap of 1.1 eV, and so making a good ohmic contact to it can be straightforward without additional issues. In other words, the layer can be doped high enough and the band gap is low enough such that the contact resistance is low.

In an alternative embodiment, a high band gap contact layer 129, composed of InGaAs, is deposited on the BSF layer 128. InGaAs can have a band gap of 0.7 eV and can form a good contact layer.

The composition of contact layer 129 located at the bottom (non-illuminated) side of the lowest band gap photovoltaic cell (i.e., subcell "D" in the depicted embodiment) in a multijunction photovoltaic cell, can be formulated to reduce absorption of the light that passes through the cell, so that (i) the backside ohmic metal contact layer below it (on the non-illuminated side) will also act as a mirror layer, and (ii) the contact layer doesn't have to be selectively etched off, to prevent absorption.

It should be apparent to one skilled in the art that additional layer(s) may be added or deleted in the cell structure without departing from the scope of the present invention.

Figure 6:
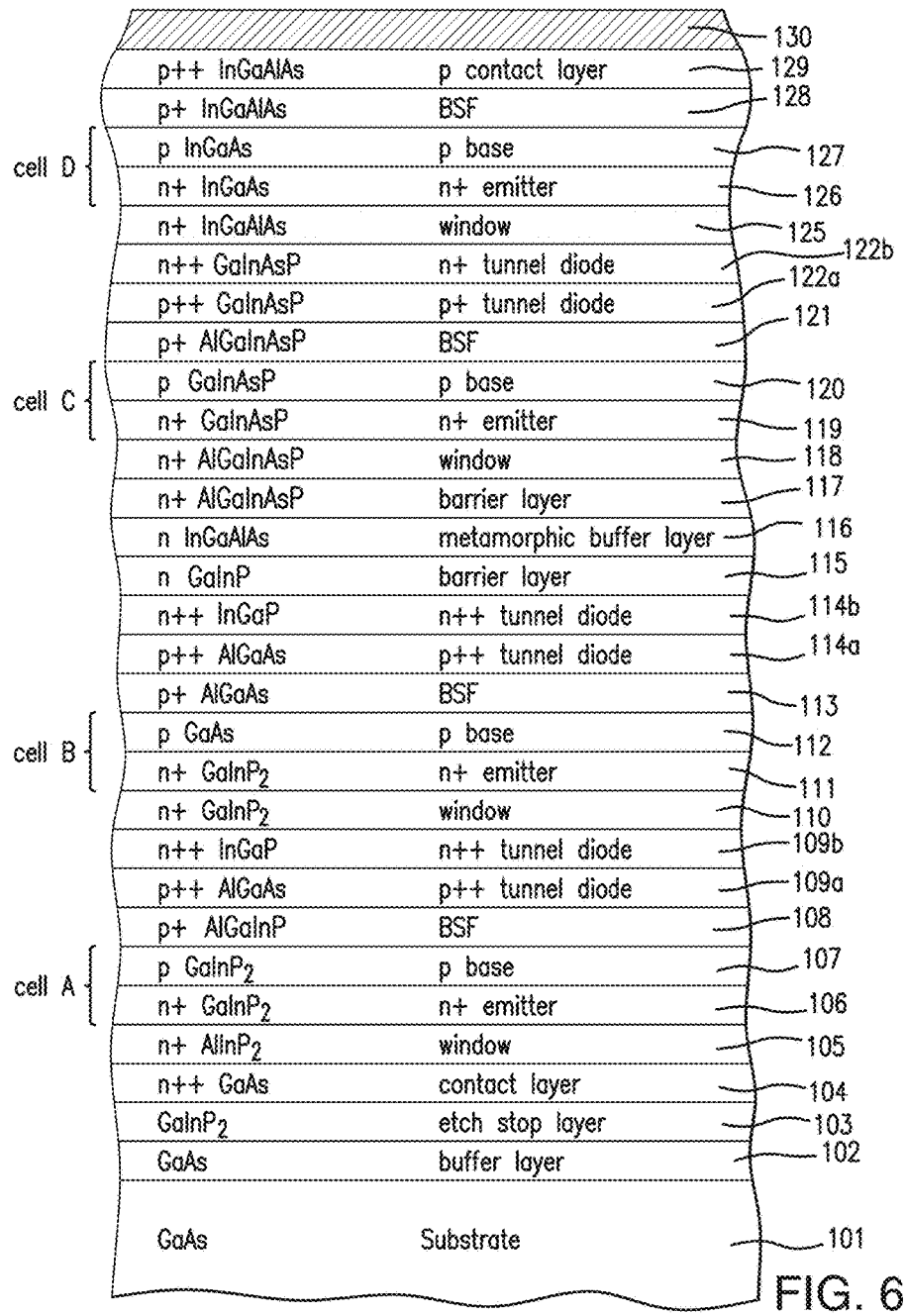
FIG. 6 is a cross-sectional view of the solar cell of FIG. 5 after the next process step.

FIG. 6 is a cross-sectional view of the solar cell of FIG. 5 after the next process step in which a metal contact layer 123 is deposited over the p+ semiconductor contact layer 122. The metal is preferably the sequence of metal layers Ti/Au/Ag/Au.

Also, the metal contact scheme chosen is one that has a planar interface with the semiconductor, after heat treatment to activate the ohmic contact. This is done so that (1) a dielectric layer separating the metal from the semiconductor doesn't have to be deposited and selectively etched in the metal contact areas; and (2) the contact layer is specularly reflective over the wavelength range of interest.

Figure 7:
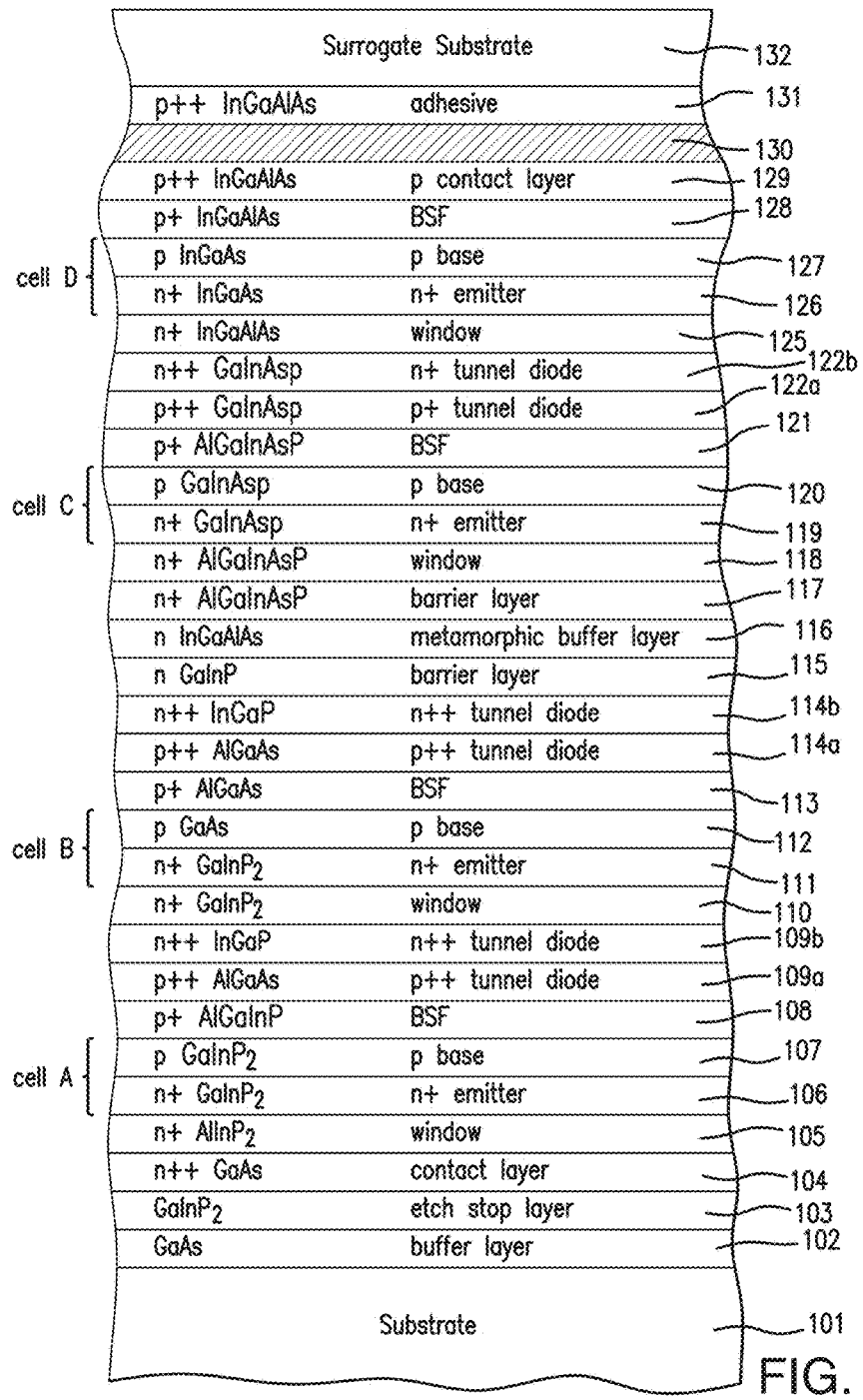
FIG. 7 is a cross-sectional view of the solar cell of FIG. 6 after the next process step in which a surrogate substrate is attached.

FIG. 7 is a cross-sectional view of the solar cell of FIG. 3 after the next process step in which an adhesive layer 131 is deposited over the metal layer 130. The adhesive is preferably Wafer Bond (manufactured by Brewer Science, Inc. of Rolla, Mo.).

In the next process step, a surrogate substrate 132, preferably sapphire, is attached. Alternative, the surrogate substrate may be GaAs, Ge or Si, or other suitable material. The surrogate substrate is about 40 mils in thickness, and is perforated with holes about 1 mm in diameter, spaced 4 mm apart, to aid in subsequent removal of the adhesive and the substrate. As an alternative to using an adhesive layer 131, a suitable substrate (e.g., GaAs) may be eutectically or permanently bonded to the metal layer 130.

Figure 8A:
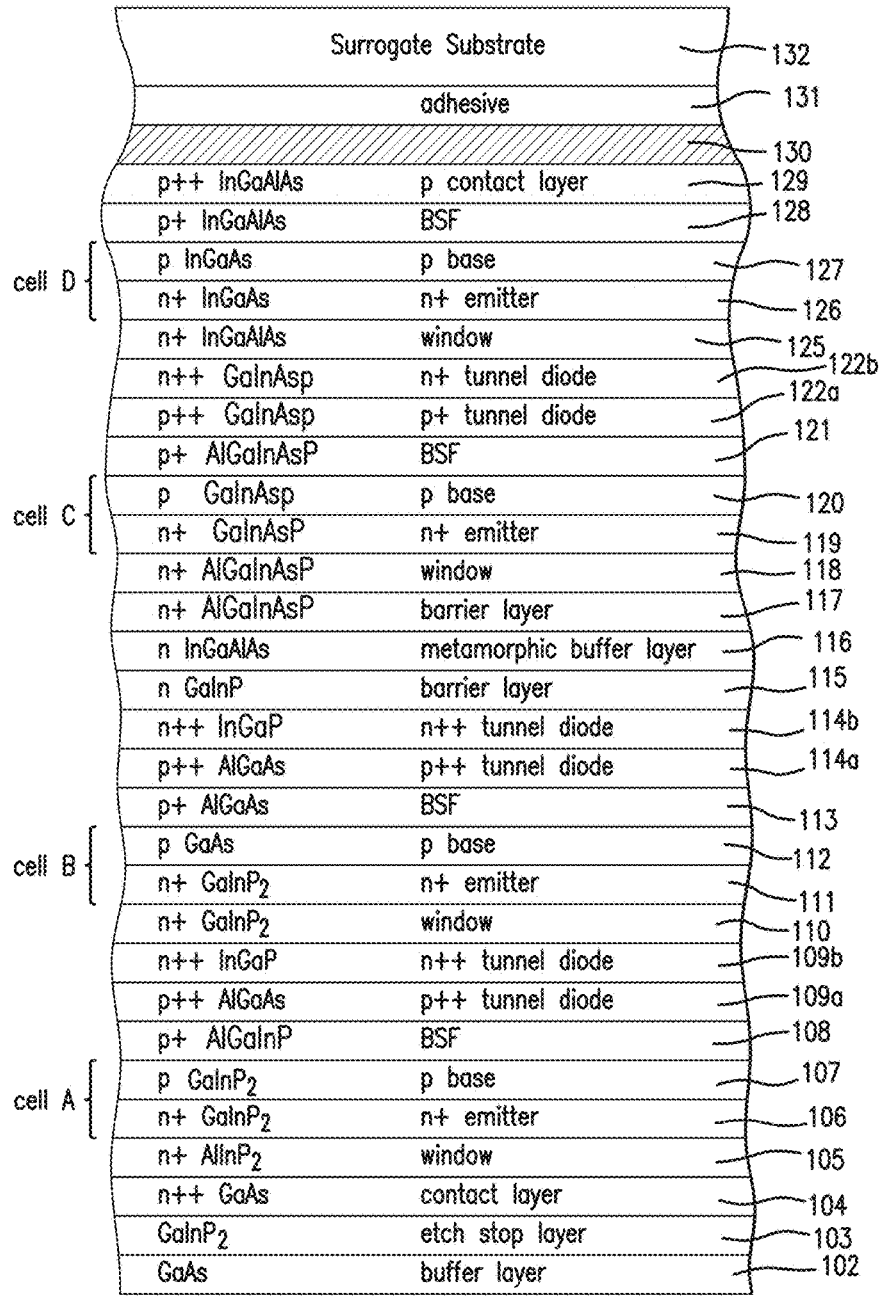
FIG. 8A is a cross-sectional view of the solar cell of FIG. 7 after the next process step in which the original substrate is unloved.

FIG. 8A is a cross-sectional view of the solar cell of FIG. 7 after the next process step in which the original substrate is removed by a sequence of lapping and/or etching steps in which the substrate 101, and the buffer layer 103 are removed. The choice of a particular etchant is growth substrate dependent.

Figure 8B:
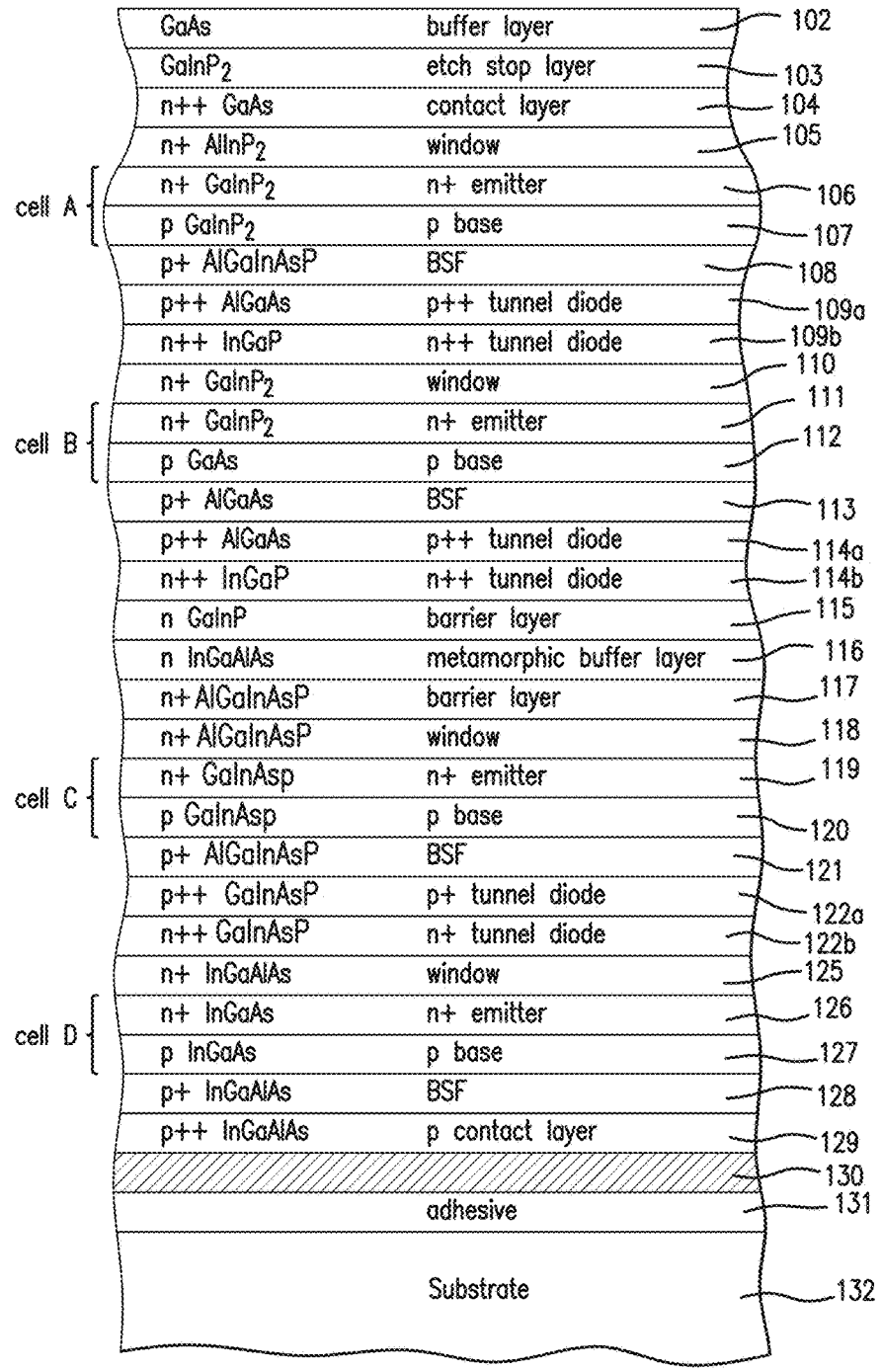
FIG. 8B is another cross-sectional view of the solar cell of FIG. 8A with the surrogate substrate on the bottom of the Figure.

FIG. 8B is a cross-sectional view of the solar cell of FIG. 8A with the orientation with the surrogate substrate 132 being at the bottom of the Figure. Subsequent Figures in this application will assume such orientation.

Figure 9:
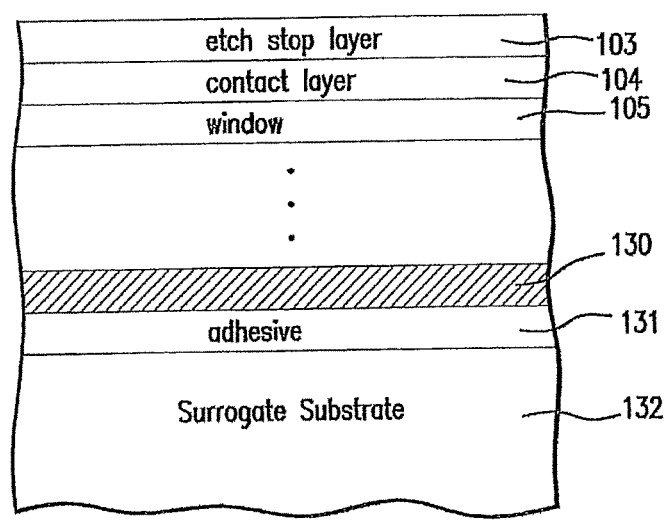
FIG. 9 is a simplified cross-sectional view of the solar cell of FIG. 8B after the next process step.

FIG. 9 is a simplified cross-sectional view of the solar cell of FIG. 8B depicting just a few of the top layers and lower layers over the surrogate substrate 132.

Figure 10:
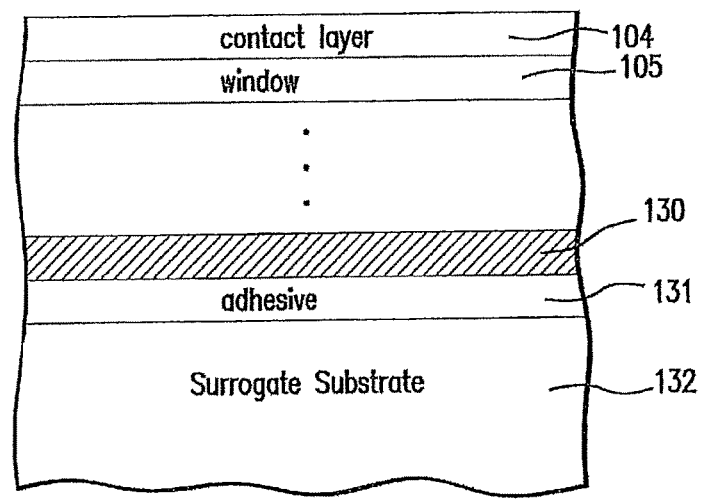
FIG. 10 is a cross-sectional view of the solar cell of FIG. 9 after the next process step.

FIG. 10 is a cross-sectional view of the solar cell of FIG. 9 after the next process step in which the etch stop layer 103 is removed by a HCl/H$_2$O solution.

Figure 11:
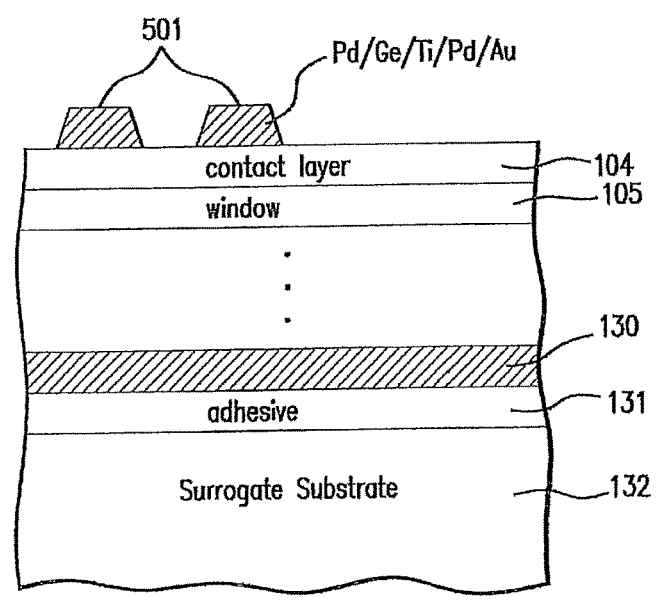
FIG. 11 is a cross-sectional view of the solar cell of FIG. 10 after the next process step.

FIG. 11 is a cross-sectional view of the solar cell of FIG. 10 after the next sequence of process steps in which a photoresist mask (not shown) is placed over the contact layer 104 to form the grid lines 501. As will be described in greater detail below, the grid lines 501 are deposited via evaporation and lithographically patterned and deposited over the contact layer 104. The mask is subsequently lifted off to form the finished metal grid lines 501 as depicted in the Figures.

As more fully described in U.S. application Ser. No. 12/218,582 filed Jul. 18, 2008, hereby incorporated by reference, the grid lines 501 are preferably composed of Pd/Ge/Ti/Pd/Au, although other suitable materials may be used as well.

Figure 12:
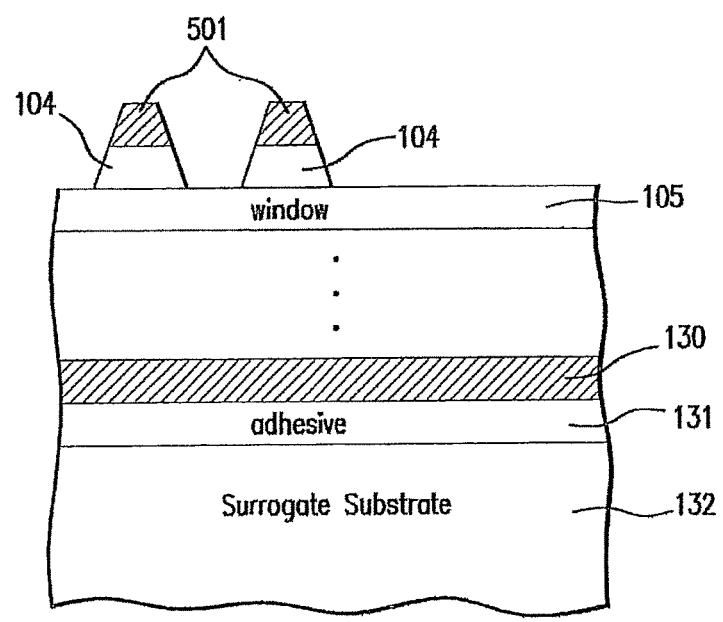
FIG. 12 is a cross-sectional view of the solar cell of FIG. 11 after the next process step.

FIG. 12 is a cross-sectional view of the solar cell of FIG. 11 after the next process step in which the grid lines are used as a mask to etch down the surface to the window layer 105 using a citric acid/peroxide etching mixture.

Figure 13A:
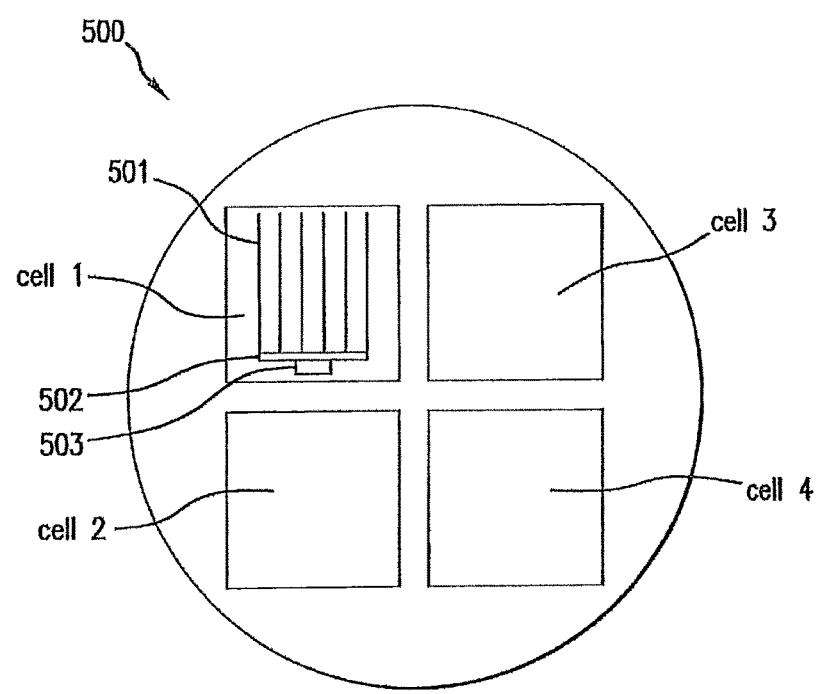
FIG. 13A is a top plan view of a wafer in which the solar cells are fabricated.

FIG. 13A is a top plan view of a wafer in which four solar cells are implemented. The depiction of four cells is for illustration for purposes only, and the present invention is not limited to any specific number of cells per wafer.

In each cell there are grid lines 501 (more particularly shown in cross-section in FIG. 9), an interconnecting bus line 502, and a contact pad 503. The geometry and number of grid and bus lines and the contact pad are illustrative and the present invention is not limited to the illustrated embodiment.

Figure 13B:
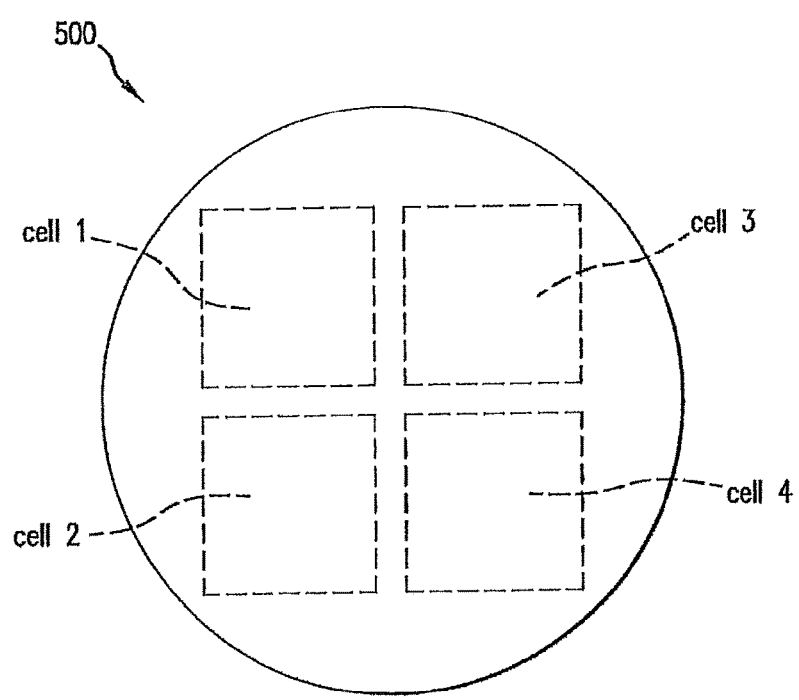
FIG. 13B is a bottom plan view of a wafer in which the solar cells are fabricated.

FIG. 13B is a bottom plan view of the wafer with four solar cells shown in FIG. 13A.

Figure 14:
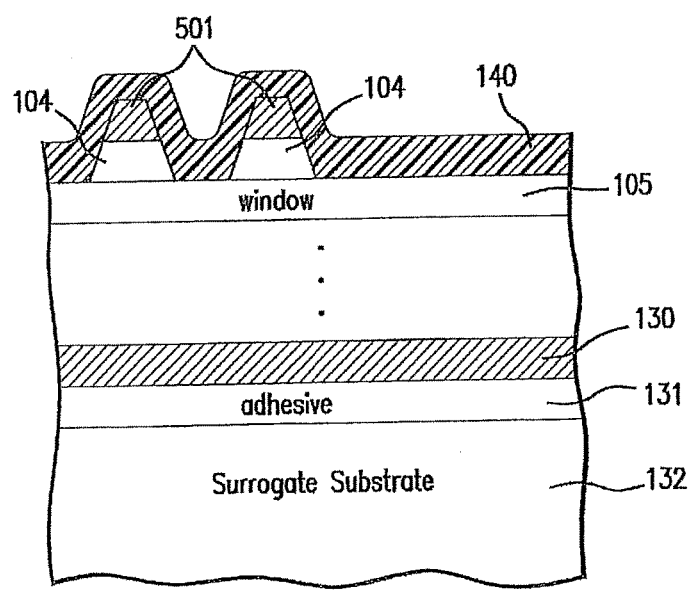
FIG. 14 is a cross-sectional view of the solar cell of FIG. 12 after the next process step.

FIG. 14 is a cross-sectional view of the solar cell of FIG. 12 after the next process step in which an antireflective (ARC) dielectric coating layer 130 is applied over the entire surface of the "bottom" side of the wafer with the grid lines 501.

Figure 15:
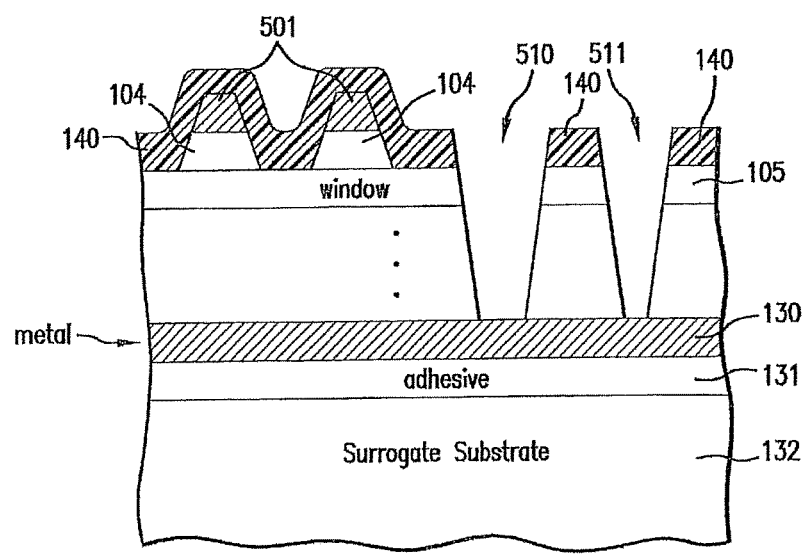
FIG. 15 is a cross-sectional view of the solar cell of FIG. 14 after the next process step.

FIG. 15 is a cross-sectional view of the solar cell of FIG. 14 after the next process step according to the present invention in which first and second annular channels 510 and 511, or portion of the semiconductor structure are etched down to the metal layer 130 using phosphide and arsenide etchants. These channels define a peripheral boundary between the cell and the rest of the wafer, and leave a mesa structure which constitutes the solar cell. The cross-section depicted in FIG. 15 is that as seen from the A-A plane shown in FIG. 17. In one embodiment, channel 510 is substantially wider than that of channel 511.

Figure 16:
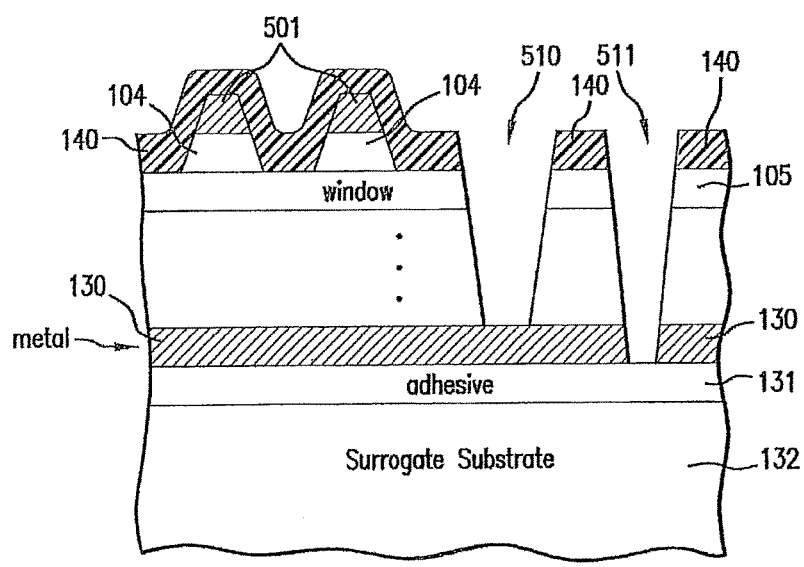
FIG. 16 is a cross-sectional view of the solar cell of FIG. 15 after the next process step

FIG. 16 is a cross-sectional view of the solar cell of FIG. 15 after the next process step in which channel 511 is exposed to a metal etchant, and that portion of the metal layer 130 located at the bottom of the channel 511 is removed. The depth of the channel 511 is thereby extended to approximately to the top surface of the adhesive layer 131.

Figure 17:
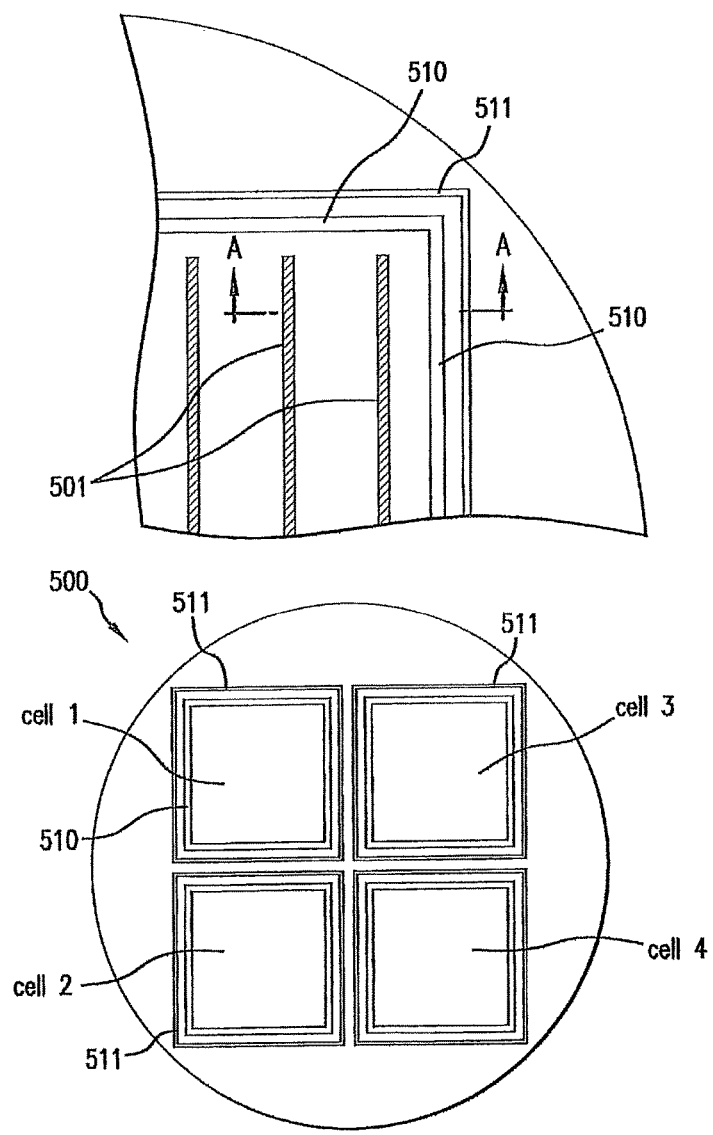
FIG. 17 is a top plan view of the wafer of FIG. 16 depicting the surface view of the trench etched around the cell.

FIG. 17 is a top plan view of the wafer of FIG. 16 depicting the channels 510 and 511 etched around the periphery of each cell.

Figure 18A:
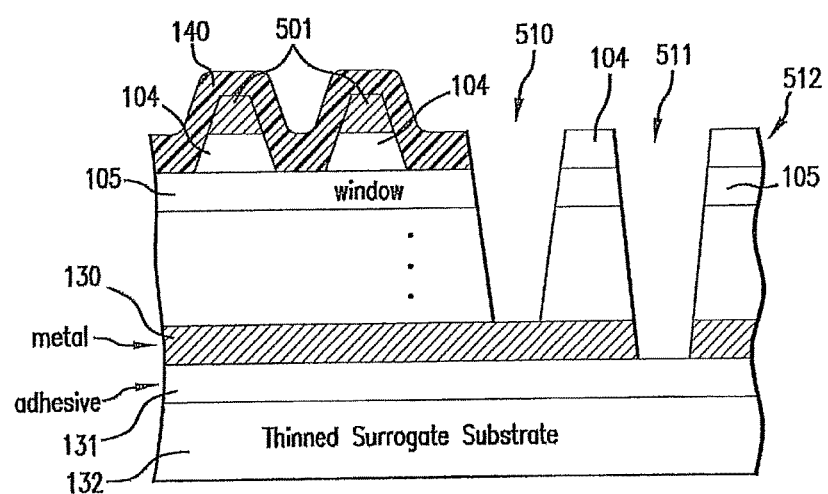
FIG. 18A is a cross-sectional view of the solar cell of FIG. 16 after the next process step in a first embodiment of the present invention.

FIG. 18A is a cross-sectional view of the solar cell of FIG. 16 after the next process step in a first embodiment of the present invention in which the surrogate substrate 132 is appropriately thinned to a relatively thin layer 132a, by grinding, lapping, or etching. In this embodiment, the thin layer 132a forms the support for the solar cell in applications where a cover glass, such as provided in the second embodiment to be described below, is not required. In such an embodiment, electrical contact to the metal contact layer 130 may be made through the channel 510 or by other via structures.

Figure 18B:
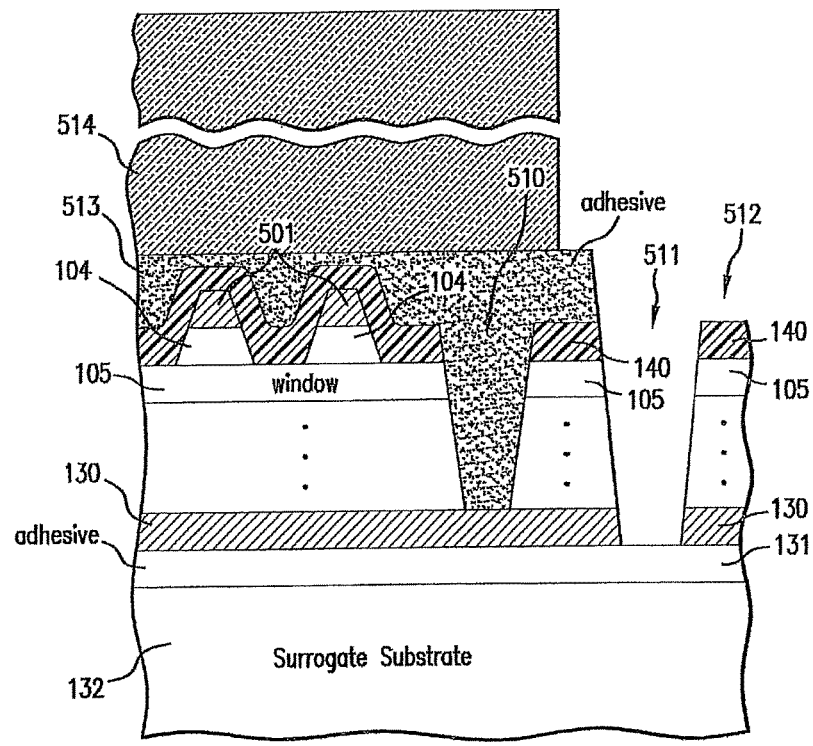
FIG. 18B is a cross-sectional view of the solar cell of FIG. 16 after the next process step in a second embodiment of the present invention.

FIG. 18B is a cross-sectional view of the solar cell of FIG. 16 after the next process step in a second embodiment of the present invention in which a cover glass 514 is secured to the top of the cell by an adhesive 513. The cover glass 514 preferably covers the entire channel 510, but does not extend to the periphery of the cell near the channel 511. Although the use of a cover glass is disclosed in one embodiment, it is not necessary for all implementations, and additional layers or structures may also be utilized for providing additional support or environmental protection to the solar cell.

Figure 19:
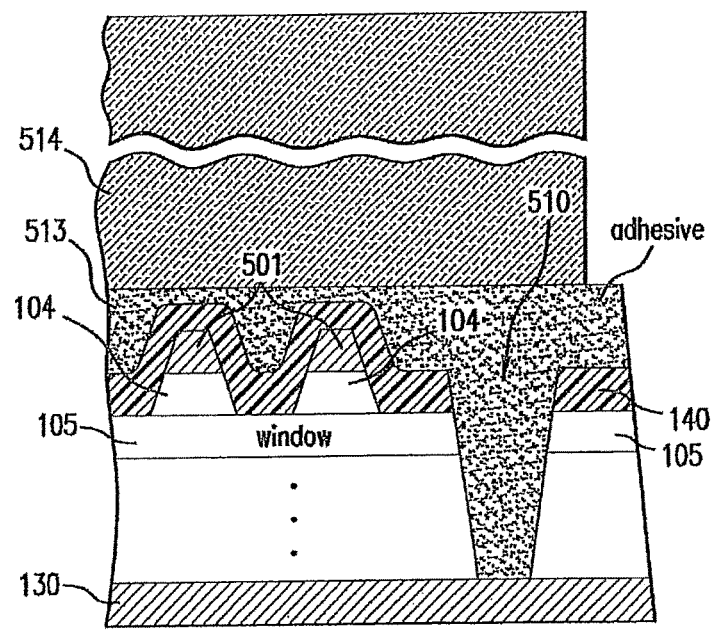
FIG. 19 is a cross-sectional view of the solar cell of FIG. 18 after the next process step.

FIG. 19 is a cross-sectional view of the solar cell of FIG. 18B after the next process step of the present invention in which the adhesive layer 131, the surrogate substrate 132 and the peripheral portion 512 of the wafer is entirely removed, breaking off in the region of the channel 510, leaving only the solar cell with the cover glass 514 (or other layers or structures) on the top, and the metal contact layer 130 on the bottom, which forms the backside contact of the solar cell. The surrogate substrate is preferably removed by the use of the etchant EKC 922. As noted above, the surrogate substrate includes perforations over its surface that allow the flow of etchant through the surrogate substrate 132 to permit its lift off. The surrogate substrate may be reused in subsequent wafer processing operations.

Figure 20:
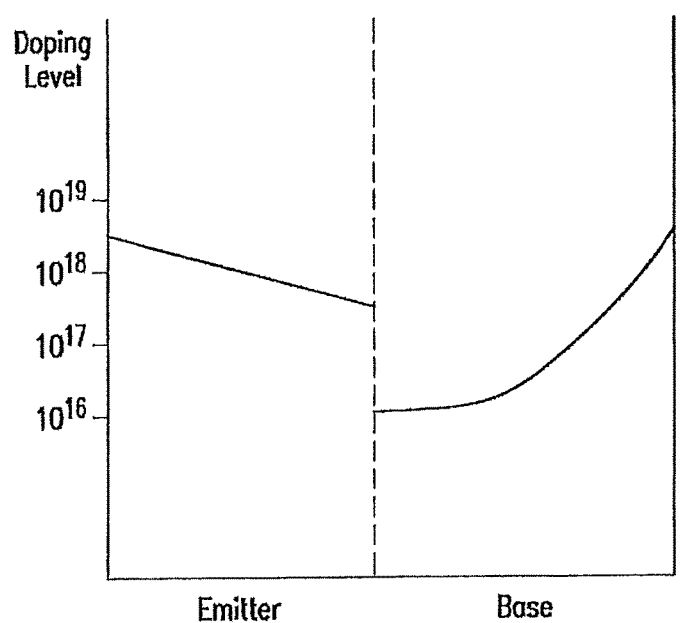
FIG. 20 is a graph of the doping profile in a base and emitter layers of a subcell in the metamorphic solar cell according to the present invention.

FIG. 20 is a graph of a doping profile in the emitter and base layers in one or more subcells of the inverted metamorphic multijunction solar cell of the present invention. The various doping profiles within the scope of the present invention, and the advantages of such doping profiles are more particularly described in U.S. application Ser. No. 11/956,069 filed Dec. 13, 2007, herein incorporated by reference. The doping profiles depicted herein are merely illustrative, and other more complex profiles may be utilized as would be apparent to those skilled in the art without departing from the scope of the present invention.

Figure 21:
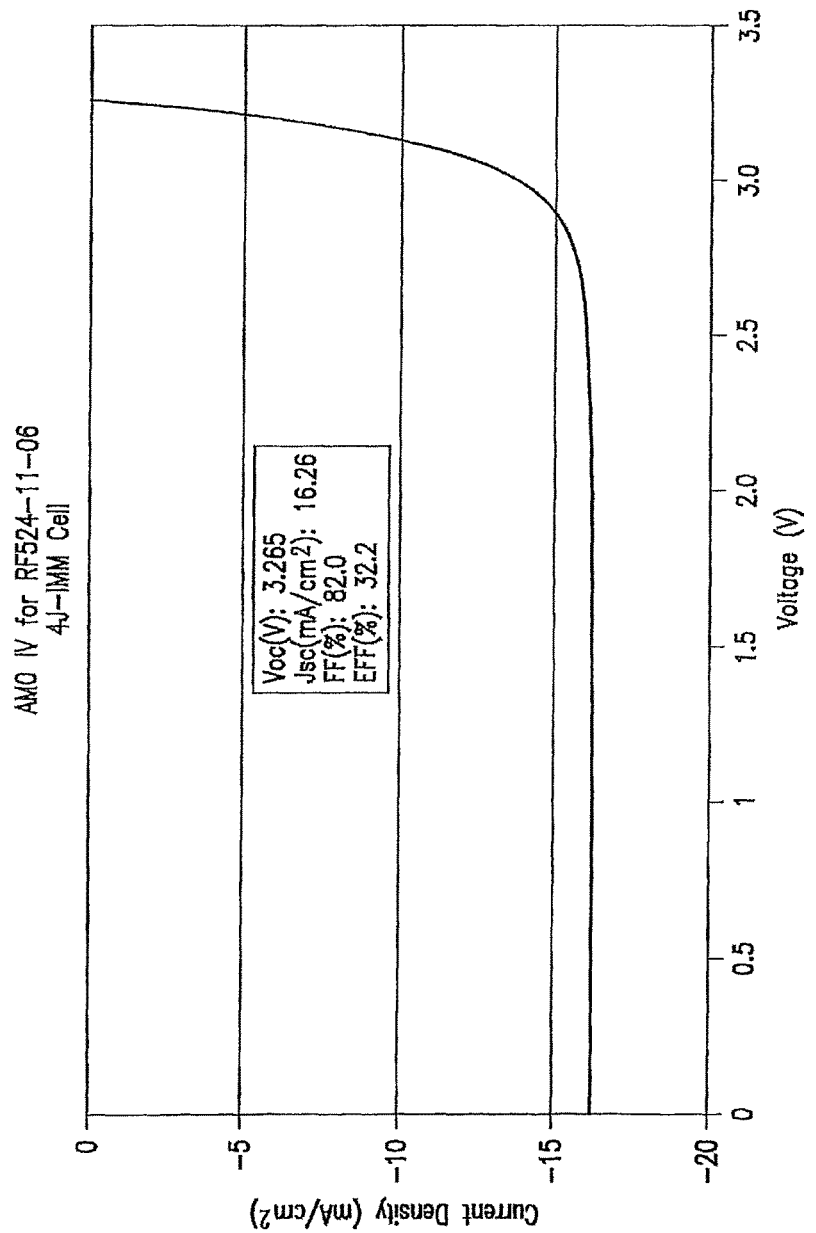
FIG. 21 is a graph that depicts the current and voltage characteristics of an inverted metamorphic multijunction solar cell according to the present invention.

FIG. 21 is a graph that depicts the current and voltage characteristics of one of the test solar cells fabricated according to the present invention. In this test cell, the lower fourth subcell had a band gap in the range of approximately 0.6 to 0.8 eV, the third subcell had a band gap in the range of approximately 0.9 to 1.1 eV, the second subcell had a band gap in the range of approximately 1.35 to 1.45 eV and the upper subcell had a band gap in the range of 1.8 to 2.1 eV. The solar cell was measured to have an open circuit voltage ($V_{oc}$) of approximately 3.265 volts, a short circuit current of approximately 16.26 mA/cm$^2$, a fill factor of approximately 82%, and an efficiency of 32.2%.

Figure 22:
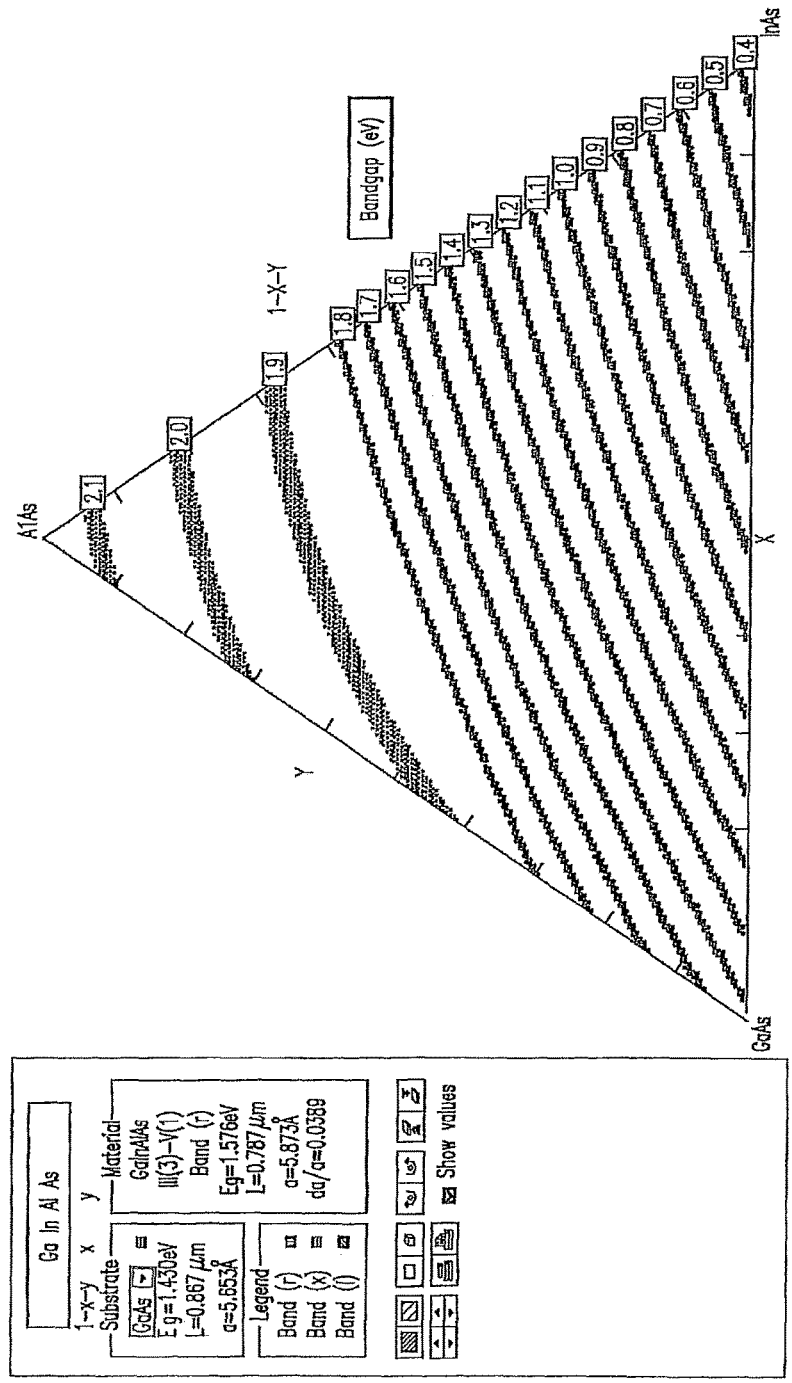
FIG. 22 is a diagram representing the range of band gaps of various GaInAlAs materials as a function of the relative concentration of Al, In, and Ga.

FIG. 22 is a diagram representing the range of band gaps of various GaInAlAs materials as a function of the relative concentration of Al, In, and Ga. This diagram illustrates how the selection of a constant band gap sequence of layers of GaInAlAs used in the metamorphic layer may be designed through the appropriate selection of the relative concentration of Al, In, and Ga to meet the different lattice constant requirements for each successive layer. Thus, whether 1.6 eV, 1.5 eV, 1.1 eV, or other band gap value is the desired constant band gap, the diagram illustrates a continuous curve for each band gap, representing the incremental changes in constituent proportions as the lattice constant changes, in order for the layer to have the required band gap and lattice constant.

Figure 23:
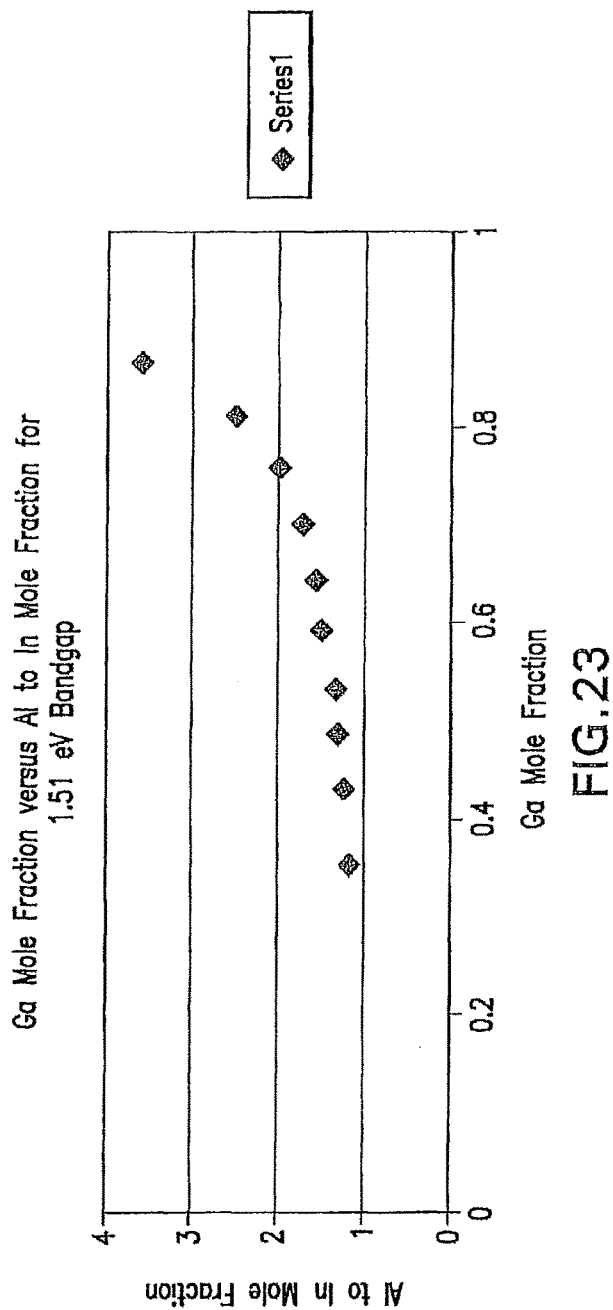
FIG. 23 is a graph representing the Ga mole fraction versus the Al to In mole fraction in GaInAlAs materials that is necessary to achieve a constant 1.5 eV band gap.

FIG. 23 is a graph that further illustrates the selection of a constant band gap sequence of layers of GaInAlAs used in the metamorphic layer by representing the Ga mole fraction versus the Al to In mole fraction in GaInAlAs materials that is necessary to achieve a constant 1.5 eV band gap.

Figure 24:
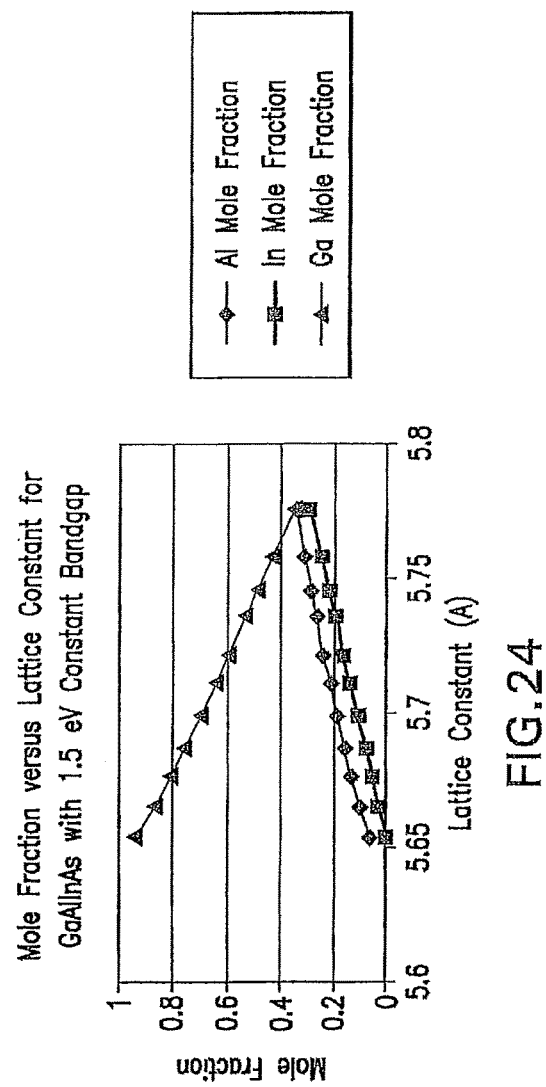
FIG. 24 is a graph representing the mole fraction versus lattice constant in GaInAlAs materials that is necessary to achieve a constant 1.5 eV band gap.

FIG. 24 is a graph that further illustrates the selection of a constant band gap sequence of layers of GaInAlAs used in the metamorphic layer by representing the mole fraction versus lattice constant in GaInALAs materials that is necessary to achieve a constant 1.5 eV band gap.

It will be understood that each of the elements described above, or two or more together, also may find a useful application in other types of constructions differing from the types of constructions described above.

Although one embodiment of the present invention utilizes a vertical stack of four subcells, the present invention can apply to stacks with fewer or greater number of subcells, i.e. two junction cells, three junction cells, five junction cells, etc. In the case of four or more junction cells, the use of more than one metamorphic grading interlayer may also be utilized.

In addition, although the present embodiment is configured with top and bottom electrical contacts, the subcells may alternatively be contacted by means of metal contacts to laterally conductive semiconductor layers between the subcells. Such arrangements may be used to form 3-terminal, 4-terminal, and in general, n-terminal devices. The subcells can be interconnected in circuits using these additional terminals such that most of the available photogenerated current density in each subcell can be used effectively, leading to high efficiency for the multijunction cell, notwithstanding that the photogenerated current densities are typically different in the various subcells.

As noted above, the present invention may utilize an arrangement of one or more, or all, homojunction cells or subcells, i.e., a cell or subcell in which the p-n junction is formed between a p-type semiconductor and an n-type semiconductor both of which have the same chemical composition and the same band gap, differing only in the dopant species and types, and one or more heterojunction cells or subcells. Subcell A, with p-type and n-type InGaP is one example of a homojunction subcell. Alternatively, as more particularly described in U.S. application Ser. No. 12/023,772 filed Jan. 31, 2008, the present invention may utilize one or more, or all, heterojunction cells or subcells, i.e., a cell or subcell in which the p-n junction is formed between a p-type semiconductor and an n-type semiconductor having different chemical compositions of the semiconductor material in the n-type regions, and/or different band gap energies in the p-type regions, in addition to utilizing different dopant species and type in the p-type and n-type regions that form the p-n junction.

In some cells, a thin so-called "intrinsic layer" may be placed between the emitter layer and base layer, with the same or different composition from either the emitter or the base layer. The intrinsic layer may function to suppress minority-carrier recombination in the space-charge region. Similarly, either the base layer or the emitter layer may also be intrinsic or not-intentionally-doped ("NID") over part or all of its thickness.

The composition of the window or BSF layers may utilize other semiconductor compounds, subject to lattice constant and band gap requirements, and may include AlInP, AlAs, AlP, AlGaInP, AlGaAsP, AlGaInAs, AlGaInPAs, GaTnP, GaInAs, GaInPAs, AlGaAs, AlInAs, AlInPAs, GaAsSb, AlAsSb, GaAlAsSb, AlInSb, GaInSb, AlGaInSb, AlN, GaN, InN, GaInN, AlGaInN, GaInNAs, AlGaInNAs, ZnSSe, CdSSe, and similar materials, and still fall within the spirit of the present invention.

While the invention has been illustrated and described as embodied in a inverted metamorphic multijunction solar cell, it is not intended to be limited to the details shown, since various modifications and structural changes may be made without departing in any way from the spirit of the present invention.

Thus, while the description of this invention has focused primarily on solar cells or photovoltaic devices, persons skilled in the art know that other optoelectronic devices, such as, thermophotovoltaic (TPV) cells, photodetectors and light-emitting diodes (LEDS) are very similar in structure, physics, and materials to photovoltaic devices with some minor variations in doping and the minority carrier lifetime. For example, photodetectors can be the same materials and structures as the photovoltaic devices described above, but perhaps more lightly-doped for sensitivity rather than power production. On the other hand LEDs can also be made with similar structures and materials, but perhaps more heavily-doped to shorten recombination time, thus radiative lifetime to produce light instead of power. Therefore, this invention also applies to photodetectors and LEDs with structures, compositions of matter, articles of manufacture, and improvements as described above for photovoltaic cells.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed is:

1. A multijunction solar cell comprising:
   a first sequence of layers of semiconductor material forming a first set of one or more solar subcells;
   a first threading dislocation inhibition layer adjacent to said first sequence of layers;
   a graded interlayer directly adjacent to said first threading dislocation inhibition layer, said graded interlayer being composed of $(In_xGa_{1-x})_yAl_{1-y}As$, wherein $0<x<1$ and $0<y<1$ with x and y selected such that said graded interlayer has a band gap of 1.6 eV±3% that remains constant throughout its thickness, said graded interlayer having a composition that differs from that of the first threading dislocation inhibition layer;
   a second sequence of layers of semiconductor material forming a second set of one or more solar subcells, the second sequence of layers being disposed on a side of the graded interlayer opposite a side on which the first sequence of layers is disposed;
   wherein the graded interlayer is compositionally graded to lattice match a closest solar subcell of the first set on one side of the graded interlayer and to lattice match a closest solar subcell of the second set on a second opposite side of the graded interlayer;
   the multijunction solar cell further comprising a high band gap contact layer adjacent said second sequence of layers, wherein the high band gap contact layer is composed of p++ type InGaAlAs.

2. The multijunction solar cell as defined in claim 1, wherein the first set of one or more solar cells comprises an upper first solar subcell having a first band gap in the range of approximately 1.8 to 2.1 eV and a second solar subcell adjacent to said first solar subcell and having a second band gap smaller than said first band gap and in the range of approximately 1.35 to 1.45 eV; and wherein the second set of one or more solar cells comprises a third solar subcell to said graded interlayer, said third subcell having a fourth band gap smaller than said second band gap and in the range of approximately 0.9 to 1.1 eV such that said third subcell is lattice mismatched with respect to said second subcell; and a lower fourth solar subcell adjacent to said third solar subcell, said lower fourth subcell having a fifth band gap smaller than said fourth band gap and in the range of approximately 0.6 to 0.8 eV.

3. The multijunction solar cell as defined in claim 2, wherein the upper first subcell is composed of an InGaP emitter layer and an InGaP base layer.

4. The multijunction solar cell as defined in claim 2, wherein the second subcell is composed of InGaP emitter layer and a GaAs base layer.

5. The multijunction solar cell as defined in claim 2, wherein the third subcell is composed of an InGaP emitter layer and an InGaAs base layer.

6. The multijunction solar cell as defined in claim 2, wherein the lower fourth subcell is composed of an InGaAs base layer and an InGaAs emitter layer.

7. The multijunction solar cell as defined in claim 2, wherein the upper first subcell is composed of an InGaP emitter layer and an InGaP base layer, the second subcell is composed of InGaP emitter layer and a GaAs base layer, the third subcell is composed of an InGaP emitter layer and an InGaAs base layer, and the lower fourth subcell is composed of an InGaAs base layer and an InGaAs emitter layer.

8. The multijunction solar cell as defined in claim 1 wherein the graded interlayer is composed of a plurality of layers of InGaAlAs having monotonically changing lattice constant, each layer having a band gap of 1.6 eV.

9. The multijunction solar cell as defined in claim 1 further including a second threading dislocation inhibition layer disposed between the graded interlayer and the second sequence of layers, the second threading dislocation inhibition layer being disposed directly adjacent to the graded interlayer and having a composition different from that of the graded interlayer.

10. The multijunction solar cell as defined in claim 9 wherein the composition of the second threading dislocation inhibition layer differs from the composition of the second threading dislocation inhibition layer.

11. The multijunction solar cell as defined in claim 10 wherein the first threading dislocation inhibition layer is composed of InGa(Al)P and has a thickness of 0.25-1.0 micron.

12. The multijunction solar cell as defined in claim 11 wherein the second threading dislocation inhibition layer is composed of GaInP.

* * * * *